(12) United States Patent
Shelton et al.

(10) Patent No.: US 12,184,231 B2
(45) Date of Patent: Dec. 31, 2024

(54) SOLAR PANEL HANDLING SYSTEM

(71) Applicant: The AES Corporation, Arlington, VA (US)

(72) Inventors: John Christopher Shelton, Falls Church, VA (US); Luis Herrera, Bethesda, MD (US); Deise Yumi Asami, Arlington, VA (US); Steve Gangi, Webster, NY (US); Chris Angevine, Webster, NY (US); Brian Roscoe, Webster, NY (US); David Meiller, Webster, NY (US); Adam Bowers, San Francisco, CA (US); Joseph Briney, San Francisco, CA (US)

(73) Assignee: The AES Corporation, Arlington, VA (US)

( * ) Notice: Subject to any disclaimer, the term of this patent is extended or adjusted under 35 U.S.C. 154(b) by 526 days.

(21) Appl. No.: 17/412,266

(22) Filed: Aug. 26, 2021

(65) Prior Publication Data
US 2022/0069770 A1 Mar. 3, 2022

Related U.S. Application Data

(60) Provisional application No. 63/071,823, filed on Aug. 28, 2020, provisional application No. 63/213,673, filed on Jun. 22, 2021.

(51) Int. Cl.
*H01S 4/00* (2006.01)
*H02S 99/00* (2014.01)

(52) U.S. Cl.
CPC .................................. *H02S 99/00* (2013.01)

(58) Field of Classification Search
CPC ......... H02S 99/00; H02S 20/00; H01L 31/18; Y02E 10/47; Y02E 10/50
See application file for complete search history.

(56) References Cited

U.S. PATENT DOCUMENTS 8,240,109 B2  8/2012  Cusson et al.
8,590,223 B2  11/2013 Kilgore et al.
(Continued)

OTHER PUBLICATIONS

International Search Report and Written Opinion issued on Dec. 13, 2021 in International Application No. PCT/US2021/047849.
(Continued)

*Primary Examiner* — Paul D Kim
(74) *Attorney, Agent, or Firm* — Morgan, Lewis & Bockius LLP

(57) ABSTRACT

A system for installing a solar panel may include an end of arm assembly tool and a linear guide assembly coupled to the end of arm assembly tool. The end of arm assembly tool includes a frame and plurality of attachment devices, such as suction cups, coupled to the frame. The linear guide assembly includes a linearly moveable clamping tool including an engagement member configured to engage a clamp assembly slidably coupled to an installation structure, and a force torque transducer configured to move the clamping tool along the installation structure. A controller configured to control the force torque transducer and the plurality of attachment devices. The end of arm assembly tool is coupled to a robotic arm and is part of an assembly robot that includes autonomous and non-autonomous vehicles. The various components can be operated by a control system based on operation instructions received from a neural network.

26 Claims, 44 Drawing Sheets

(56) References Cited

U.S. PATENT DOCUMENTS

| | | | |
|---|---|---|---|
| 8,657,991 B2 | 2/2014 | Potter et al. | |
| 8,813,460 B2* | 8/2014 | Cinnamon | F24S 25/61 52/173.3 |
| 9,136,411 B2 | 9/2015 | Jolley | |
| 9,362,442 B2 | 6/2016 | Kacandes | |
| 9,473,066 B2 | 10/2016 | Stephan et al. | |
| 9,625,180 B2 | 4/2017 | King | |
| 9,647,433 B2 | 5/2017 | Meine et al. | |
| 9,660,570 B2 | 5/2017 | Stephan et al. | |
| 9,831,817 B2 | 11/2017 | Rothschild | |
| 10,088,201 B2 | 10/2018 | Stephan et al. | |
| 10,461,682 B2 | 10/2019 | Schuit et al. | |
| 10,801,755 B1 | 10/2020 | Nemat et al. | |
| 10,845,093 B2 | 11/2020 | Stephan et al. | |
| 11,012,023 B2 | 5/2021 | Stearns et al. | |
| 2009/0185241 A1 | 7/2009 | Nepomniachtchi | |
| 2011/0000520 A1 | 1/2011 | West | |
| 2011/0240740 A1 | 10/2011 | Li et al. | |
| 2011/0284057 A1 | 11/2011 | Swahn et al. | |
| 2012/0027550 A1 | 2/2012 | Bellacicco et al. | |
| 2012/0199266 A1 | 8/2012 | Potter et al. | |
| 2012/0325761 A1* | 12/2012 | Kubsch | F24S 25/35 211/41.1 |
| 2013/0146123 A1 | 6/2013 | Park | |
| 2013/0334151 A1 | 12/2013 | Kanczuzewski et al. | |
| 2015/0059158 A1 | 3/2015 | Kacandes | |
| 2015/0059827 A1 | 3/2015 | Reed et al. | |
| 2018/0241343 A1 | 8/2018 | Jiang et al. | |
| 2019/0134822 A1 | 5/2019 | Clemenzi et al. | |
| 2020/0198131 A1 | 6/2020 | Tachi et al. | |
| 2020/0244211 A1 | 7/2020 | Kim et al. | |
| 2020/0336099 A1 | 10/2020 | DeBartolo, III et al. | |
| 2020/0350850 A1 | 11/2020 | Di Stefano et al. | |
| 2020/0358395 A1 | 11/2020 | Ke et al. | |
| 2021/0111665 A1 | 4/2021 | Van De Sande | |
| 2021/0205997 A1 | 7/2021 | Zhou et al. | |
| 2021/0211096 A1 | 7/2021 | Clemenzi et al. | |
| 2021/0264141 A1 | 8/2021 | Chojnacki | |
| 2021/0337734 A1 | 11/2021 | Jeanty et al. | |
| 2021/0379757 A1 | 12/2021 | Schneider et al. | |
| 2022/0164983 A1 | 5/2022 | Rousseau | |
| 2022/0411245 A1* | 12/2022 | Bailey | B66F 9/087 |
| 2023/0094619 A1 | 3/2023 | Shelton et al. | |
| 2024/0051145 A1 | 2/2024 | Asami et al. | |
| 2024/0051146 A1 | 2/2024 | Luan et al. | |
| 2024/0051152 A1 | 2/2024 | Tadepalli et al. | |

OTHER PUBLICATIONS

Spencer, et al., "The monocular depth estimation challenge", in Proceedings of the IEEE/CVF Winter Conference on Applications of Computer Vision (pp. 623-632) (2023).

Hirschmuller, "Stereo Processing by Semiglobal Matching and Mutual Information", in IEEE Transactions on Pattern Analysis and Machine Intelligence, vol. 30, No. 2, pp. 328-341, Feb. 2008, doi: 10.1109/TPAMI.2007.1166.

Patil et al., "A Comparative Evaluation of SGM Variants (including a New Variant, tMGM) for Dense Stereo Matching", ArXiv, abs/1911.09800 (2019).

O'Mahony et al., "Deep learning vs. traditional computer vision", in Advances in Computer Vision: Proceedings of the 2019 Computer Vision Conference (CVC), Springer Nature Switzerland AG, vol. 11 (pp. 128-144) (2020).

HypérTracker [Online]. Ita Scuola Politecnica, Nov. 2020 [retrieved on Mar. 28, 2022]. Retrieved from the Internet: <URL: https://www.asp-poli.it/projects/hypertracker/>.

Horschel, "Automatic Solar Installation" Oct. 25, 2012 (Oct. 25, 2012) entire YouTube video, in particular screenshots pp. 1-4 <retrieved from the internet: https://youtu.be/ebLam_3_Vko>.

Extended European Search Report issued in European Patent Application No. 21862779.2 dated Aug. 28, 2024.

Office Action dated Sep. 11, 2024, issued in corresponding Chilean Patent Application No. 202300535.

* cited by examiner

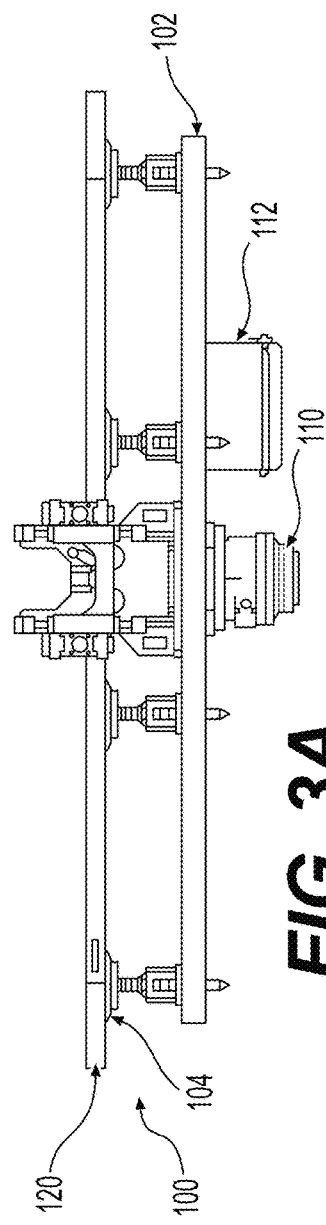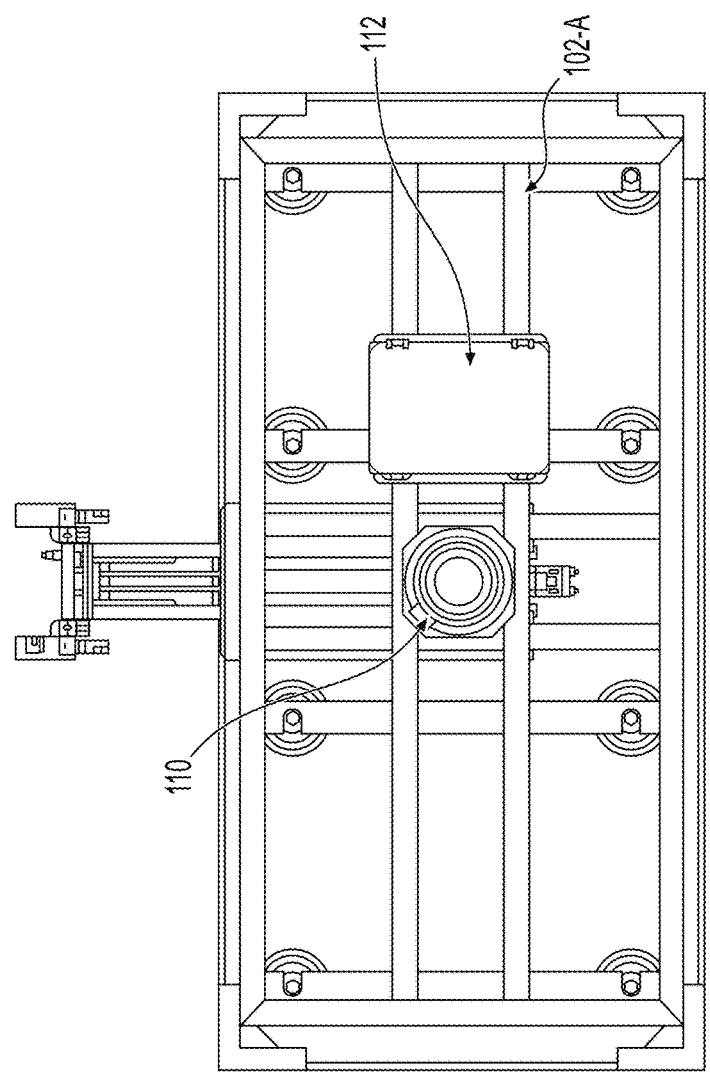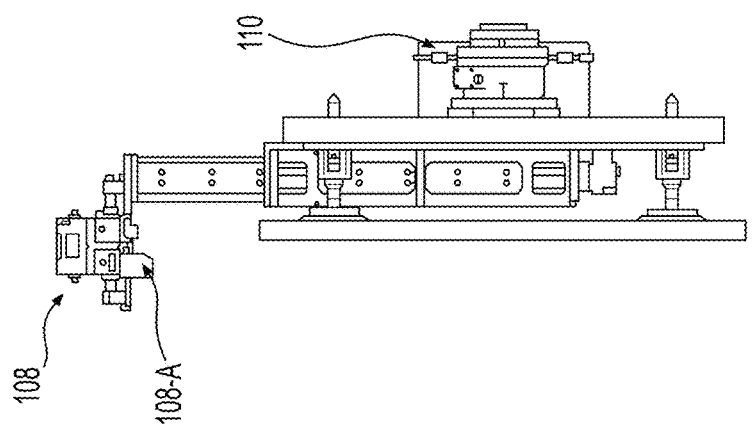

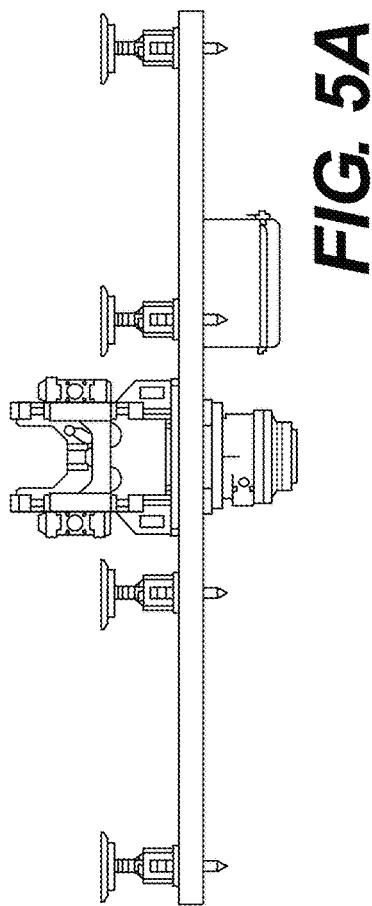
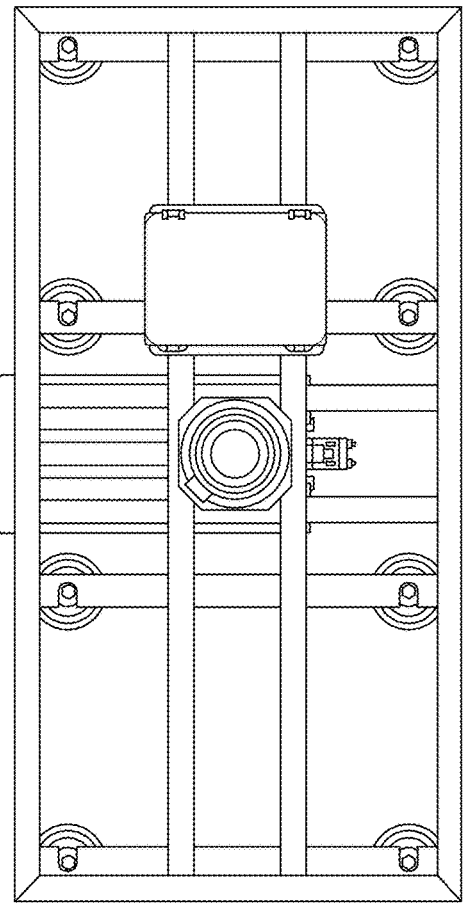
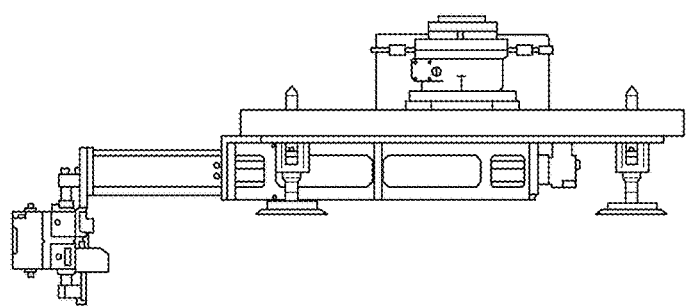
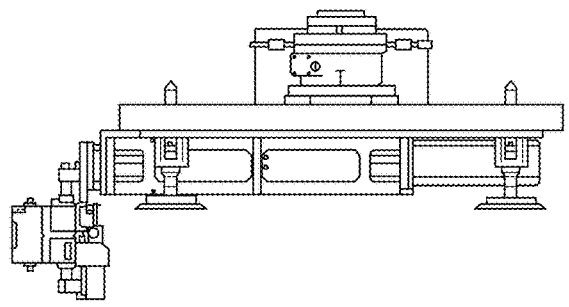
FIG. 5A
FIG. 5B
FIG. 5C
FIG. 5D

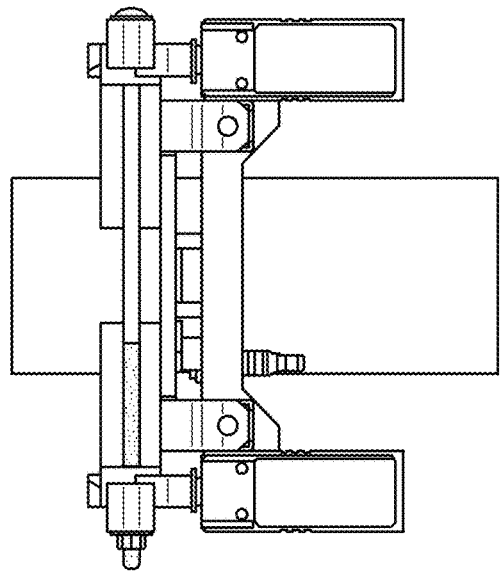
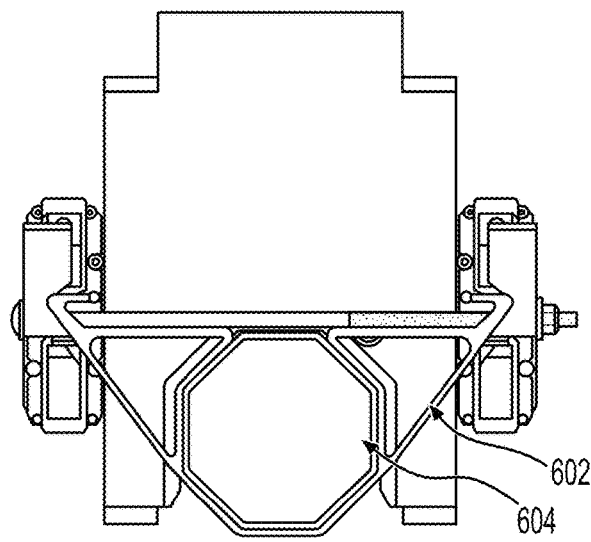
FIG. 7A            FIG. 7B
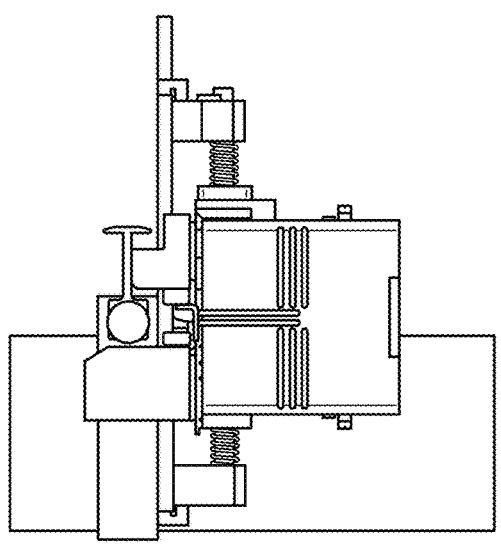
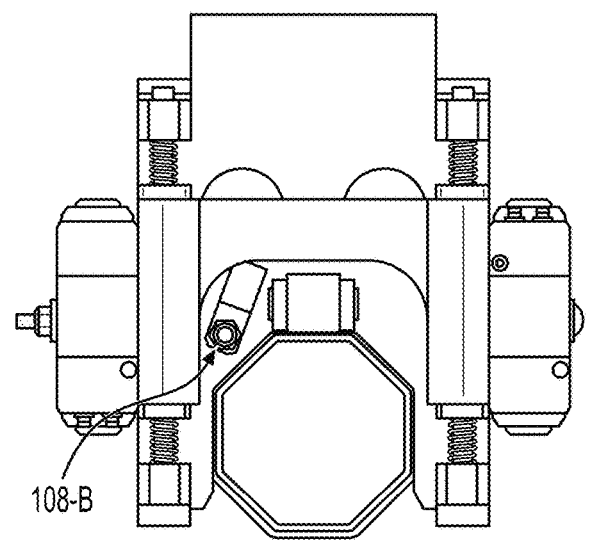
FIG. 7C            FIG. 7D

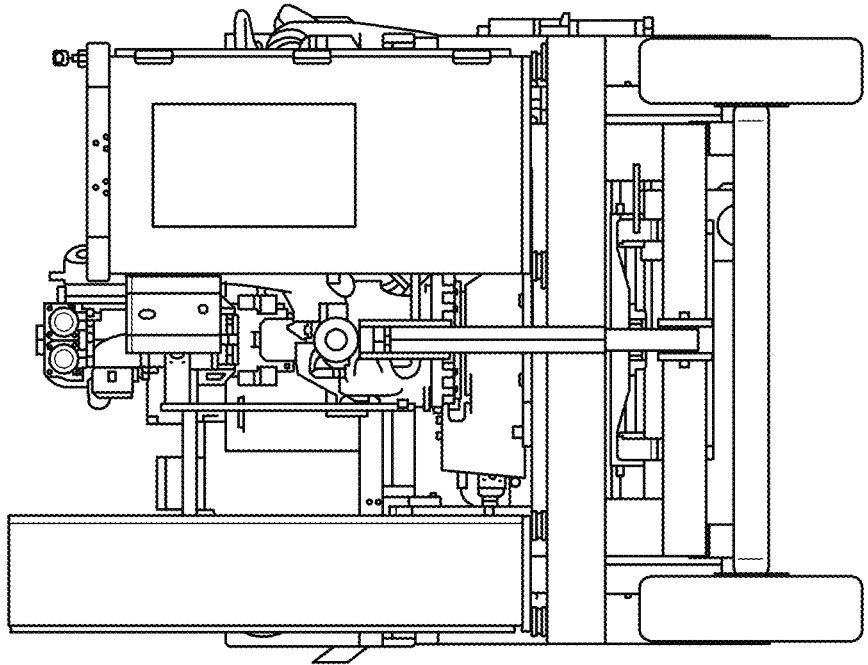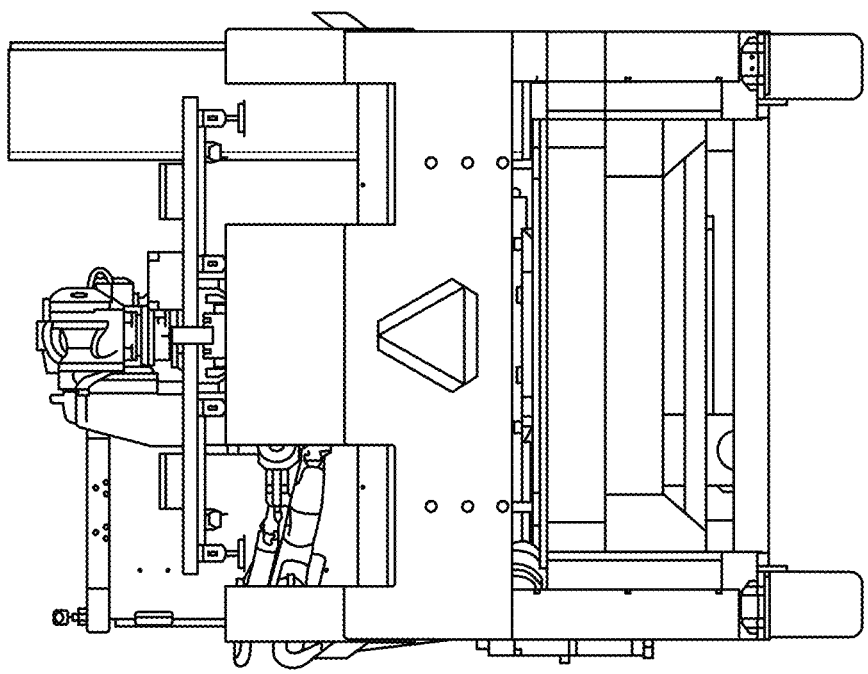
FIG. 18 CONT.

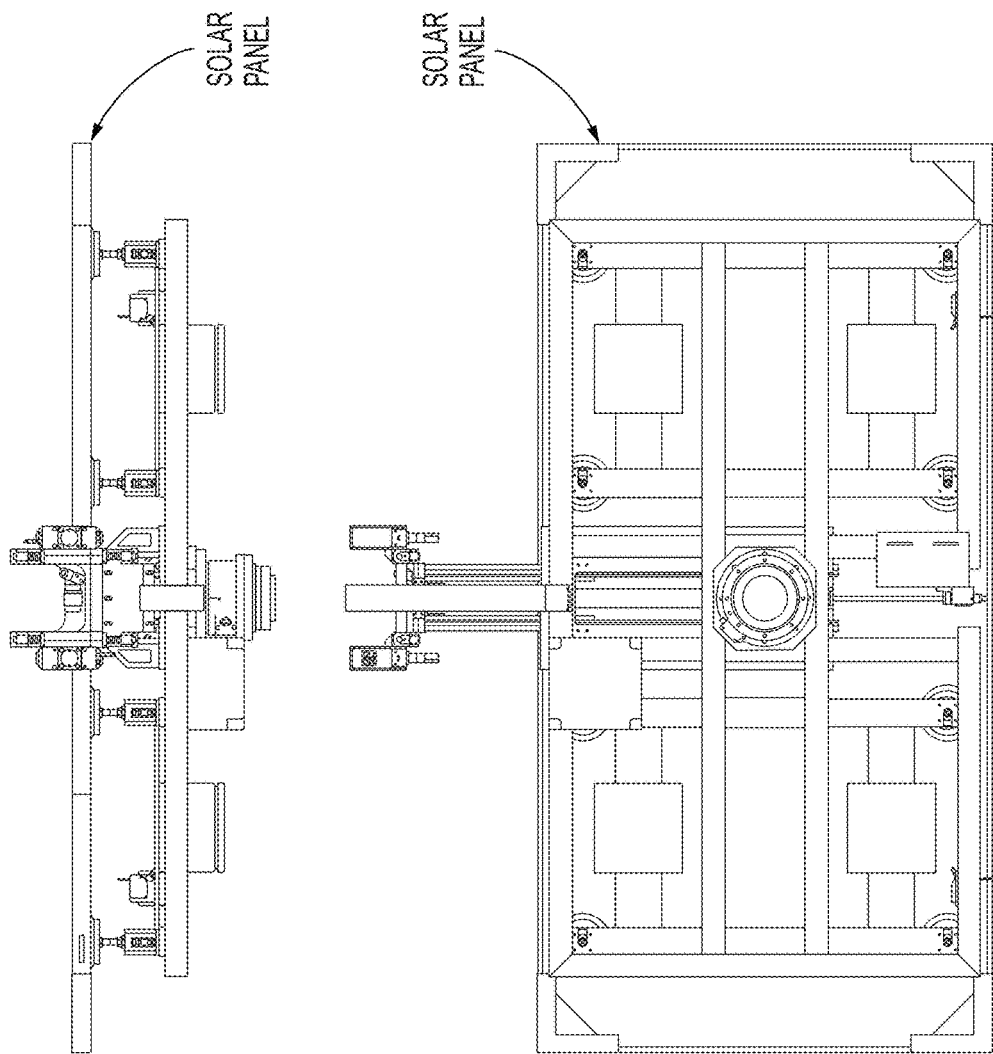
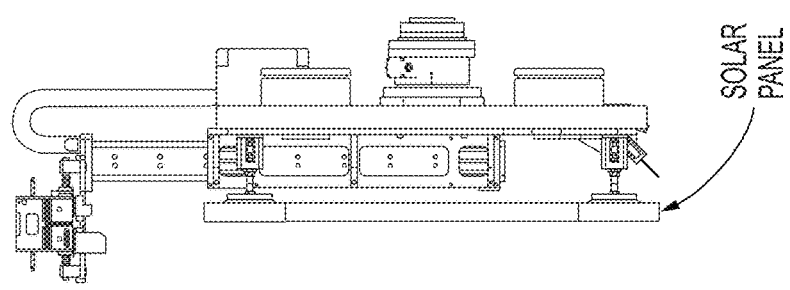
FIG. 22

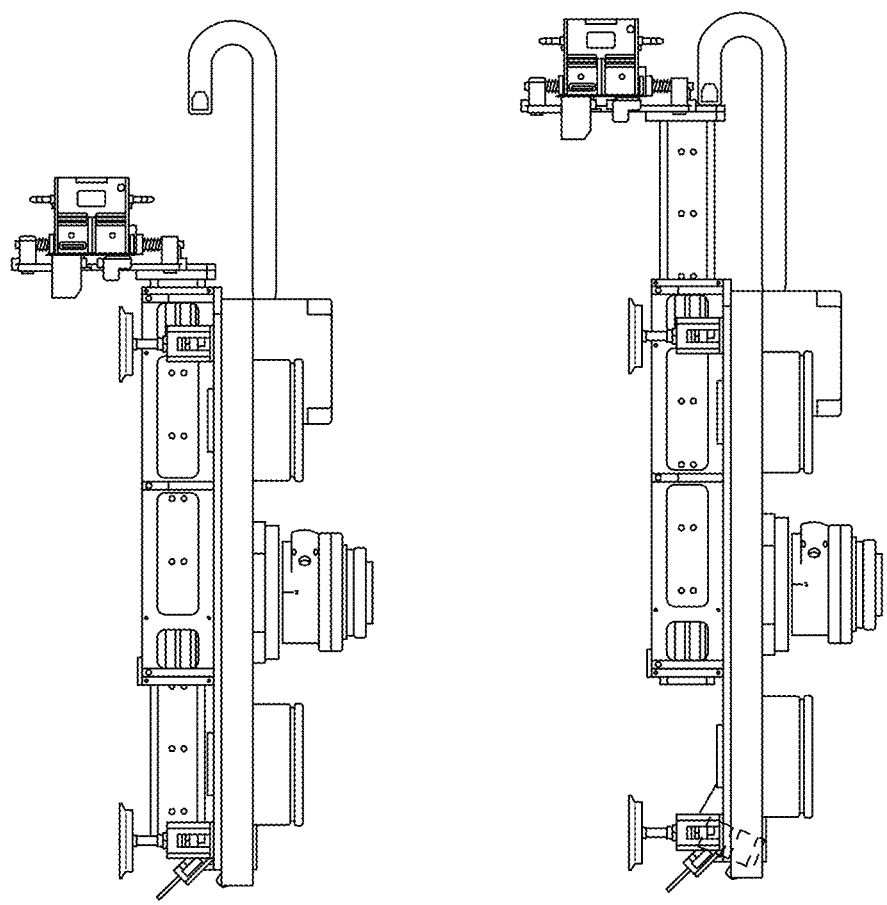
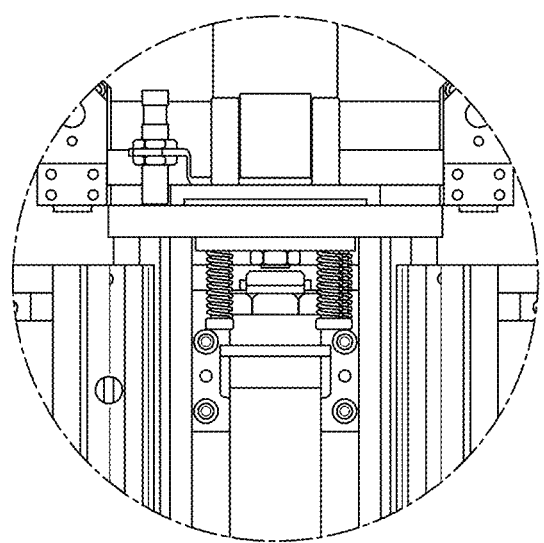
FIG. 24 CONT.

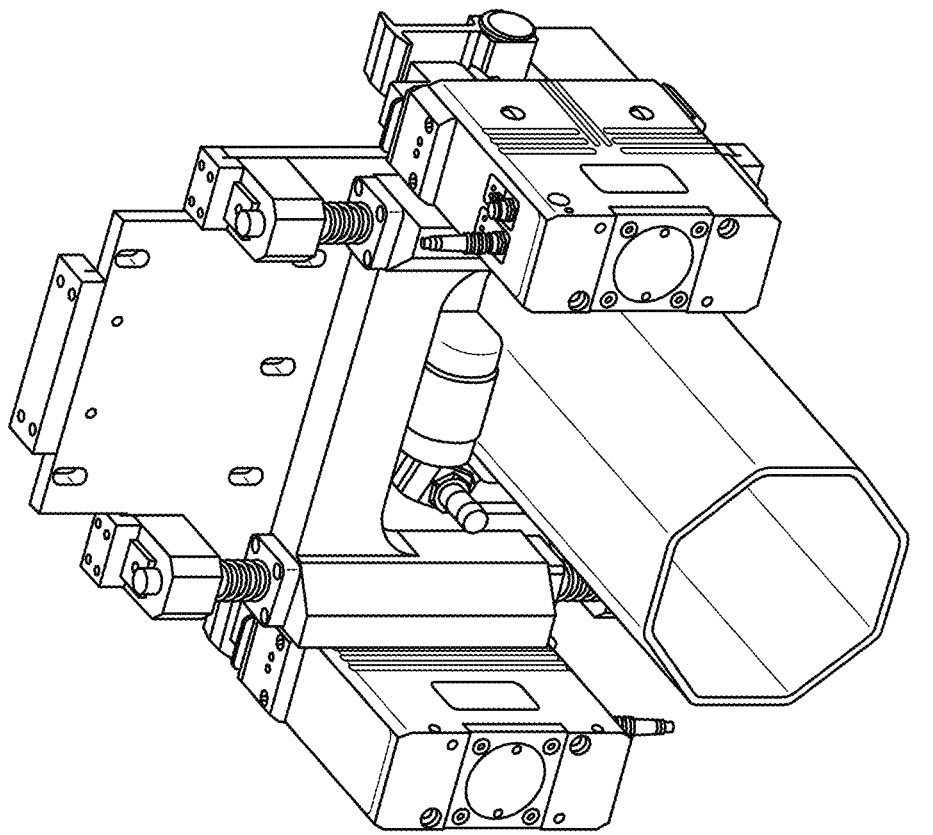
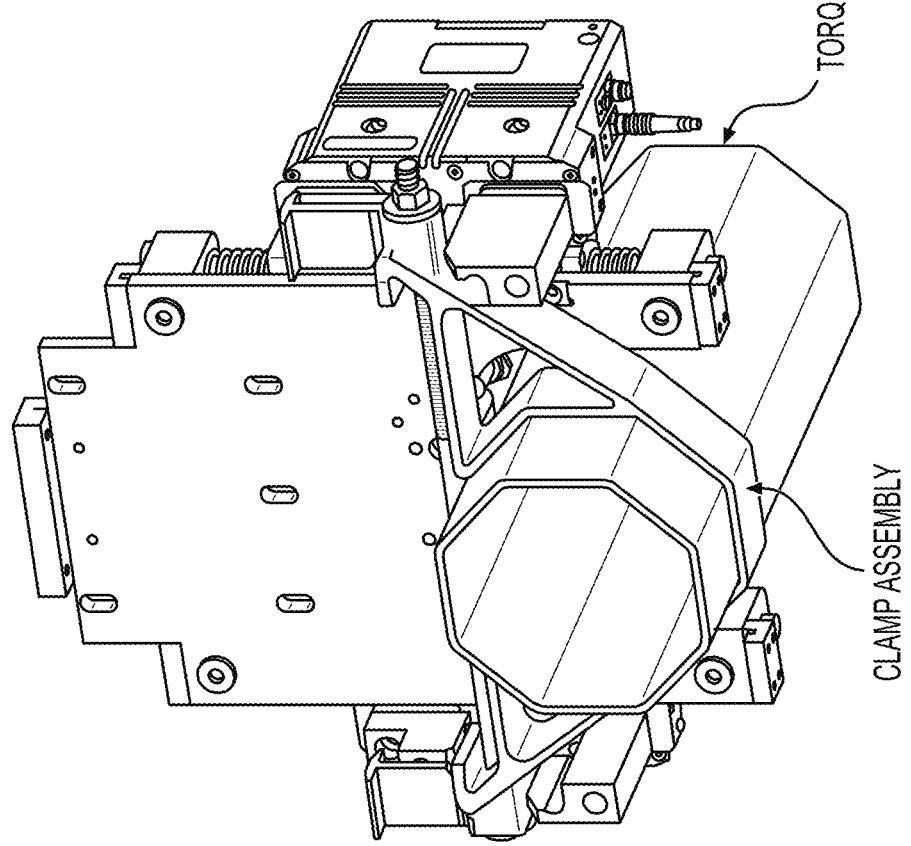
FIG. 25

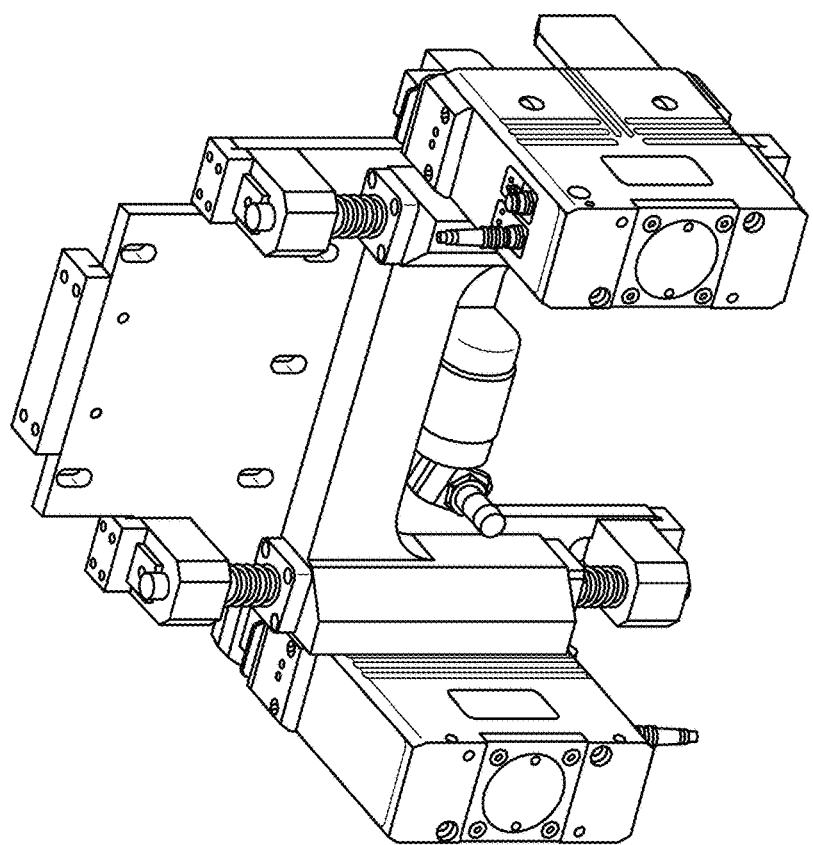
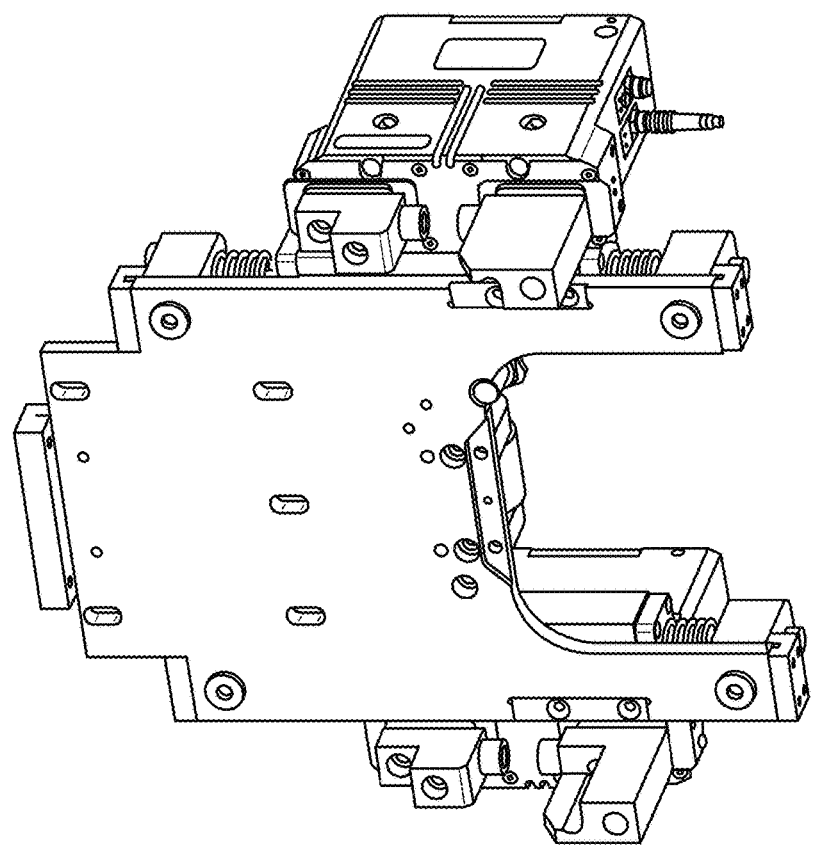
FIG. 26

SOLAR PANEL HANDLING SYSTEM

The present application claims the benefit of U.S. Provisional Application No. 63/071,823, filed Aug. 28, 2020, and U.S. Provisional Application No. 63/213,673, filed Jun. 22, 2021, both of which are hereby incorporated by reference.

BACKGROUND

Field of the Invention

The present disclosure generally relates to a solar panel handling system, and more particularly, to a system for installation of solar panels on installation structures.

Discussion of the Related Art

In the discussion that follows, reference is made to certain structures and/or methods. However, the following references should not be construed as an admission that these structures and/or methods constitute prior art. Applicant expressly reserves the right to demonstrate that such structures and/or methods do not qualify as prior art against the present invention.

Installation of a photovoltaic array typically involves affixing solar panels to an installation structure. This underlying support provides attachment points for the individual solar panels, as well as assists with routing of electrical systems and, when applicable, any mechanical components. Because of the fragile nature and large dimensions of solar panels the process of affixing solar panels to an installation structure poses unique challenges. For example, in many instances the solar panels of a photovoltaic array are installed on a rotatable structure which can rotate the solar panels about an axis to enable the array to track the sun. In such instances, it is difficult to ensure that all of the solar panels in an array are coplanar and leveled relative to the axis of the rotatable structure. Additionally, the installation costs for photovoltaic array can be a considerable portion of the total build cost for the photovoltaic array. Thus, there is a need for a more efficient and reliable solar panel handling system for installing solar panels in photovoltaic array.

SUMMARY

Accordingly, the present invention is directed to a solar panel handling system that substantially obviates one or more of the problems due to limitations and disadvantages of the related art.

The solar panel handling system disclosed herein facilitates the installation of solar panels of a photovoltaic array on a pre-existing installation structure such as, for example, a torque tube. Installing solar panels can be made more efficient and reliable by combining tooling for handling the solar panel with components that enable mating of the solar panel to the solar panel support structure.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a system for installing a solar panel may comprises an end of arm assembly tool comprising a frame and suction cups coupled to the frame, and a linear guide assembly coupled to the end of arm assembly tool, wherein the linear guide assembly includes: a linearly moveable clamping tool including an engagement member configured to engage a clamp assembly slidably coupled to an installation structure, a force torque transducer configured to move the clamping tool along the installation structure, and a junction box coupled to the frame and including a controller configured to control the force torque transducer and the suction cups, and a power supply.

In another aspect, a method of installing a solar panel may comprise engaging an end of arm assembly tool with a solar panel, the end of arm assembly tool comprising a frame and suction cups coupled to the frame, positioning the solar panel relative to an installation structure having a clamp assembly slidably coupled thereto, engaging a linear guide assembly coupled to the end of arm assembly tool with the clamp assembly, the linear guide assembly comprising a linearly moveable clamping tool including an engagement member configured to engage the clamp assembly and a force torque transducer configured to move the clamping tool along the installation structure, and actuating the force torque transducer to move the clamp assembly along the installation structure so as to engage with a side of the solar panel, thereby fixing the solar panel relative to the installation structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated herein and form part of the specification, illustrate the present invention and, together with the description, further serve to explain principles of the invention and to enable a person skilled in the relevant arts to make and use the invention. The exemplary embodiments are best understood from the following detailed description when read in conjunction with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 3A-3C show a top, front, and side view, respectively, of the solar panel handling system coupled to a single solar panel, in accordance with an embodiment of the present disclosure.

FIGS. 5A and 5B show a top view and a front view, respectively, of a solar panel handling system, in accordance with an embodiment of the present disclosure.

FIG. 5C shows a side view with a clamping tool of the solar panel handling system in a retracted position, in accordance with an embodiment of the present disclosure.

FIG. 5D shows a side view with a clamping tool in an extended or advanced position, in accordance with an embodiment of the present disclosure.

FIG. 7A shows a top view of the clamping tool of the solar panel handling system in engagement with a clamp assembly coupled to an installation structure, in accordance with an embodiment of the present disclosure.

FIG. 7B shows a front view of the clamping tool of the solar panel handling system in engagement with a clamp assembly coupled to an installation structure, in accordance with an embodiment of the present disclosure.

FIG. 7C shows a side view of the clamping tool of the solar panel handling system in engagement with a clamp assembly coupled to an installation structure, in accordance with an embodiment of the present disclosure.

FIG. 7D shows a back view of the clamping tool of the solar panel handling system in engagement with a clamp assembly coupled to an installation structure, in accordance with an embodiment of the present disclosure.

FIGS. 15-34 provide detailed illustrations of an example configuration for a system for installing solar panels according to an embodiment of the present disclosure.

Figure 1:
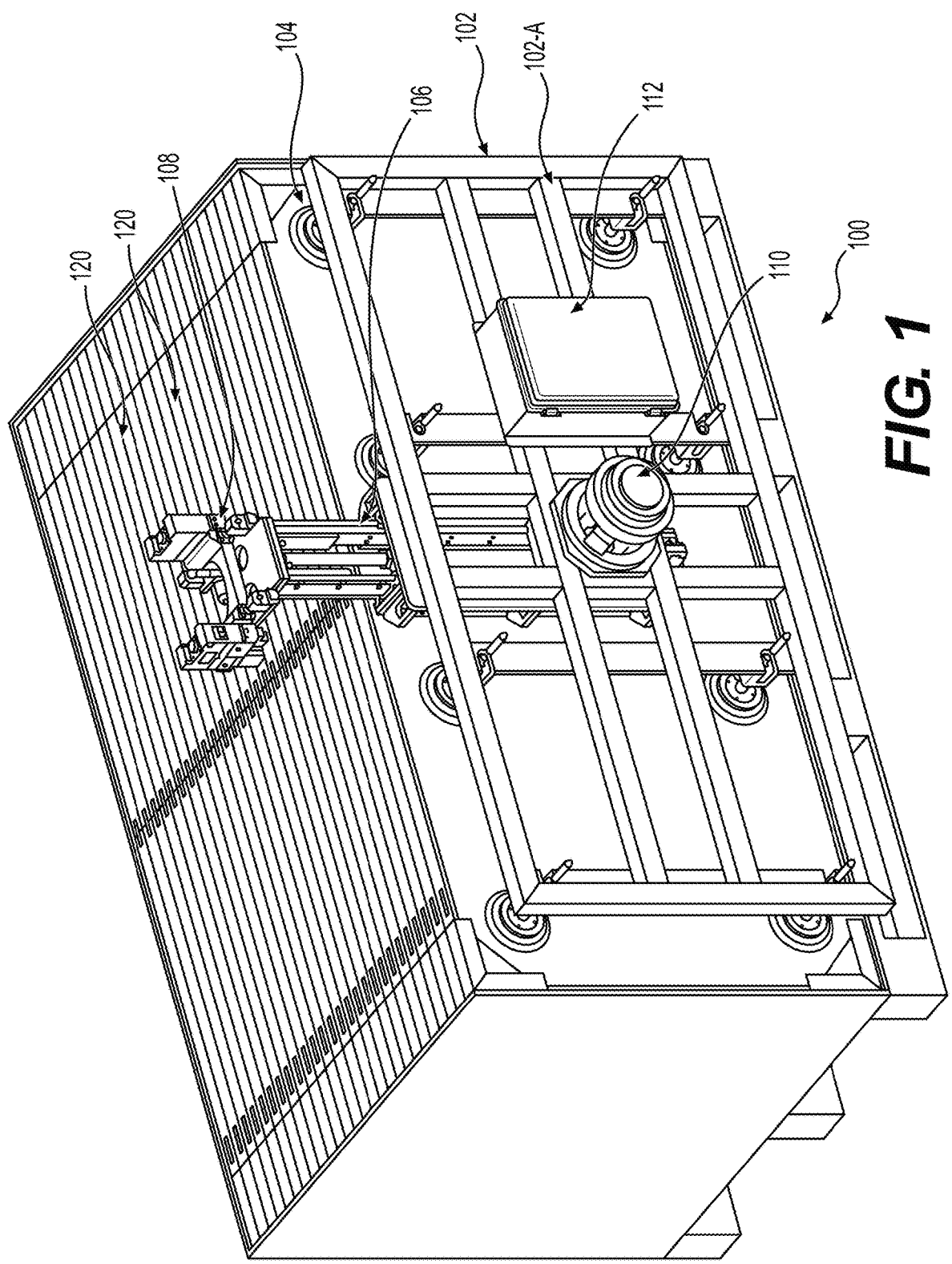
FIG. 1 shows a perspective view of a solar panel handling system along with a container of solar panels, in accordance with an embodiment of the present disclosure.
Figure 2A:
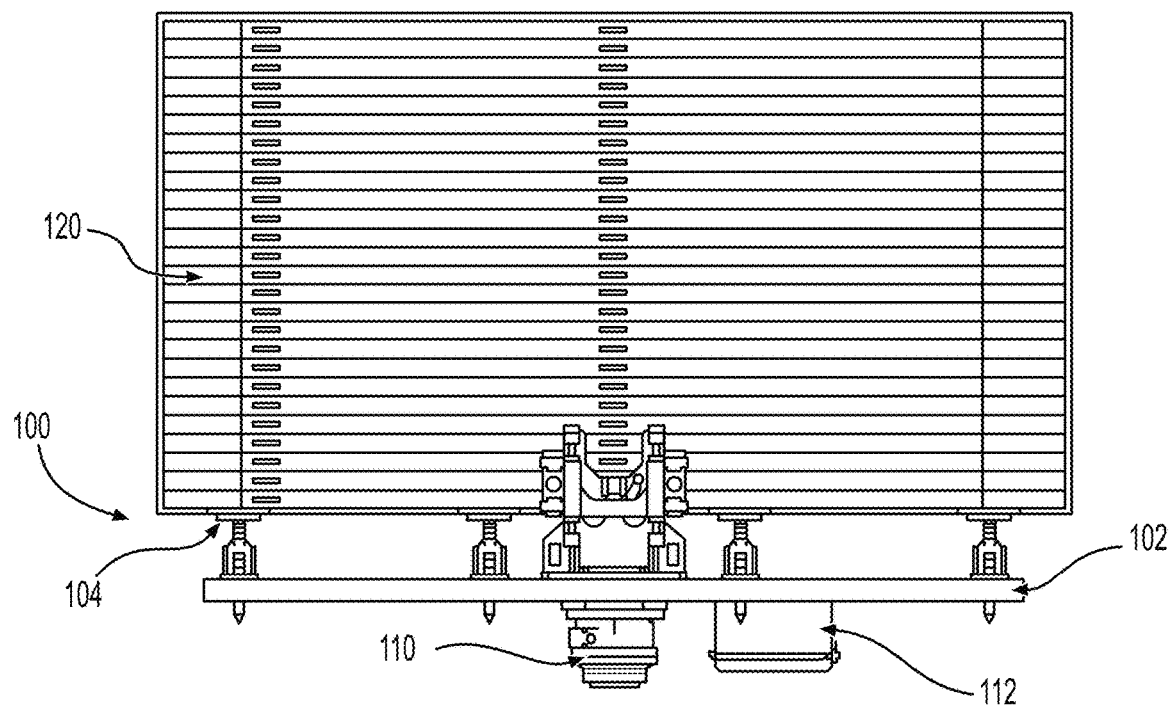
FIG. 2A-2C show a top, front, and side view, respectively, of the solar panel handling system and container of solar panels of FIG. 1.
Figure 2B:
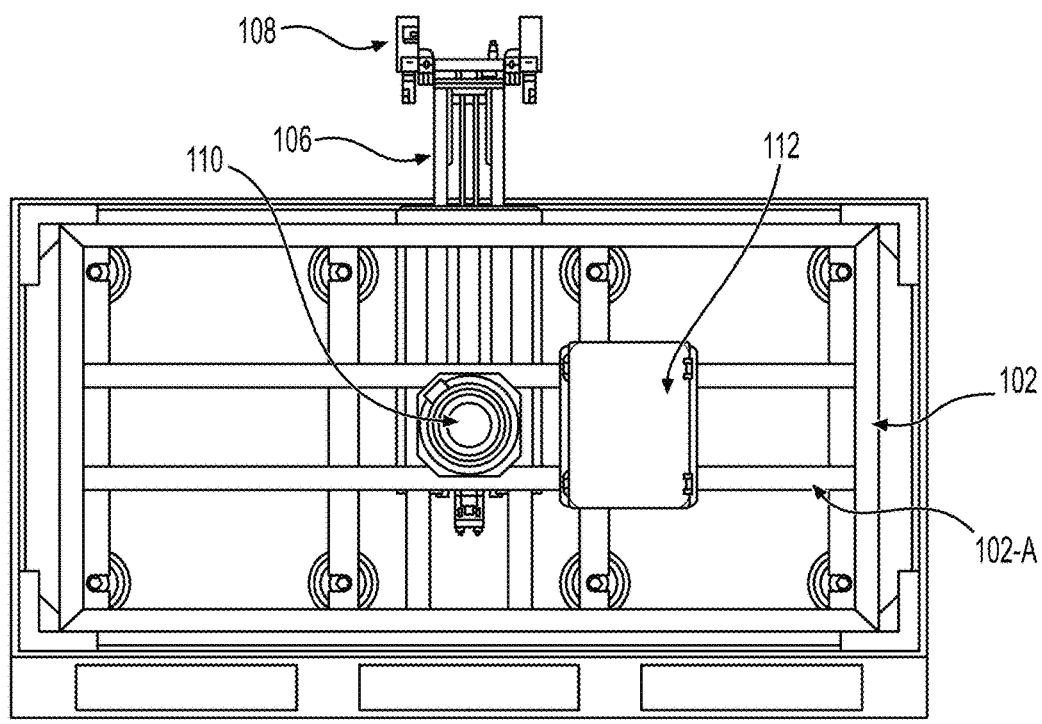
Figure 2C:
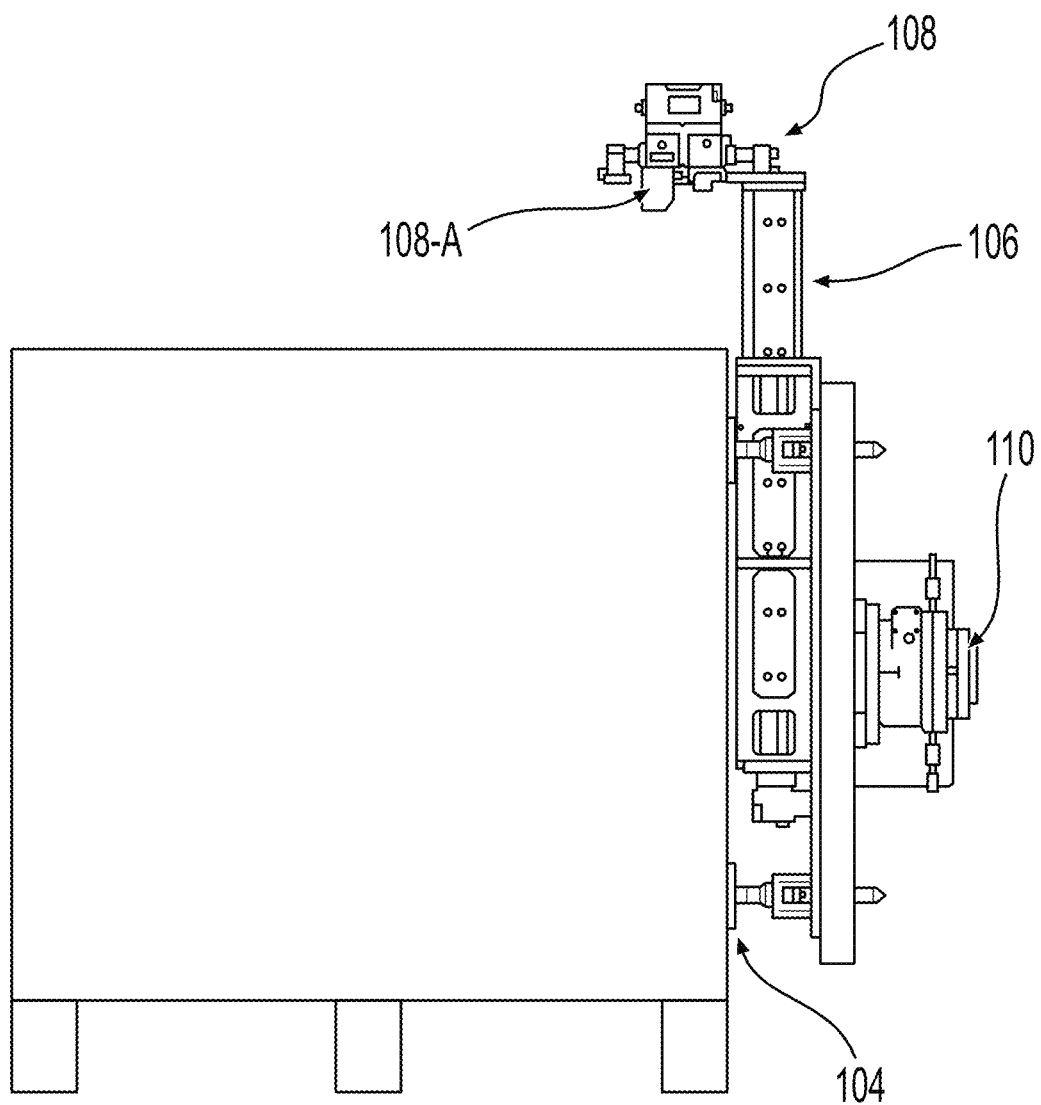
Figure 4A:
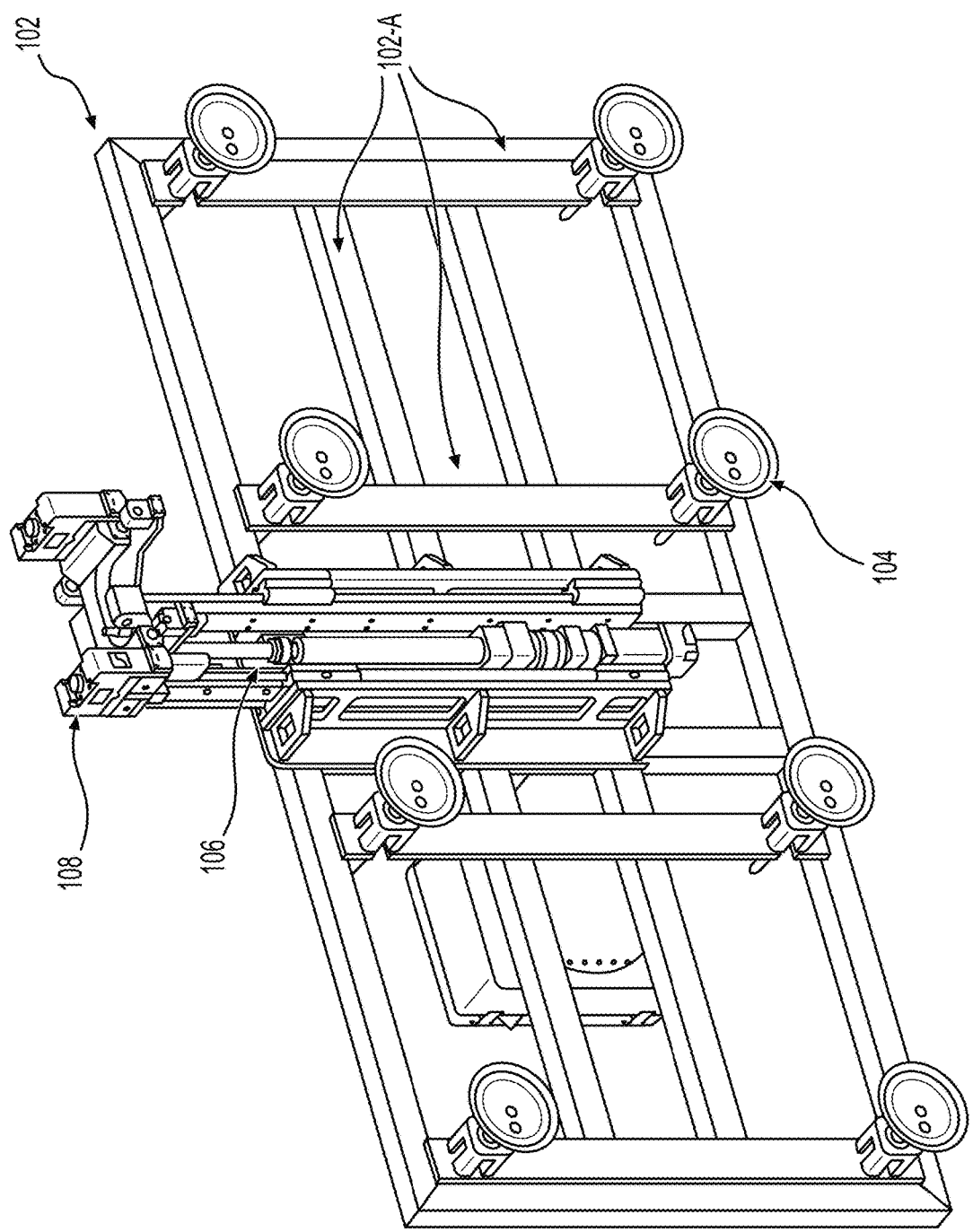
FIGS. 4A and 4B show perspective views of the solar panel handling system, in accordance with an embodiment of the present disclosure.
Figure 4B:
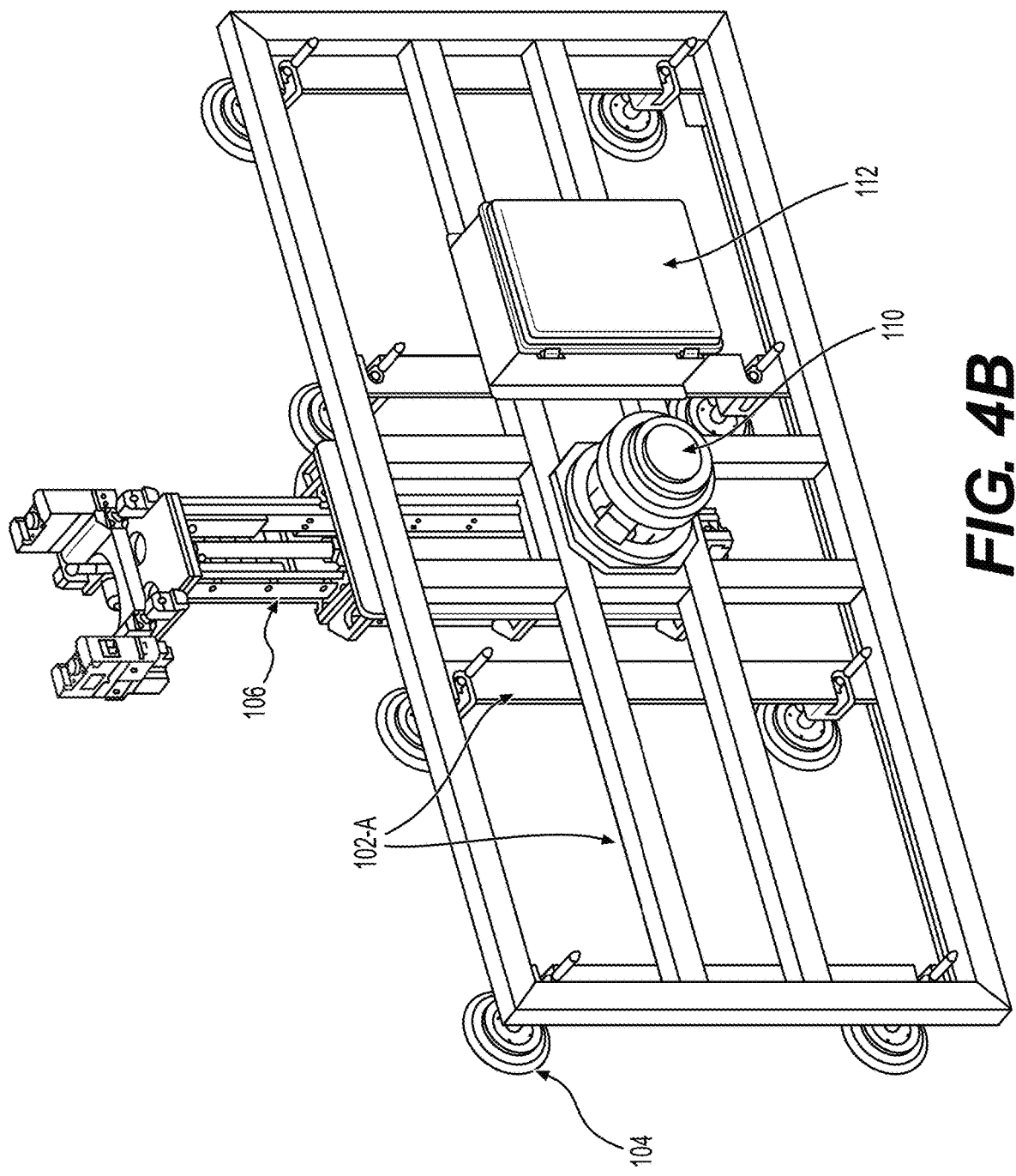

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

Reference will now be made in detail to embodiments of the present invention, examples of which are illustrated in the accompanying drawings.

FIG. 1 shows a perspective view of a solar panel handling system along with a box of solar panels, in accordance with an embodiment of the present disclosure. The solar panel handling system may include an end of arm assembly tool 100 which can couple to individual solar panels 120 from a box of solar panels and move them to a position relative to an installation structure for installation.

The end of arm assembly tool 100 may include a frame 102 and one or more attachment devices 104 coupled to the frame 102. Example attachment devices 104 include suction cups or other structures that can be releasably attached to the surface of the solar panel 120 and, at least in the aggregate, maintain attachment during manipulation of the solar panel 120 by the end of arm assembly tool 100. The frame 102 may consist of several trusses 102-A for providing structural strength and stability to the frame 102. The frame 102 also functions as a base for the end of arm assembly tool 100 and other related components of the solar panel handling system disclosed herein.

Other related components of the solar panel handling system disclosed herein may be coupled to the frame 102 so as to fix a relative position of the components on the end of arm assembly tool 100. One or more of the various components of the solar panel handling system may be coupled to one or more of the trusses 102-A so as to fix a relative position of the components on the end of arm assembly tool 100.

The attachment devices 104 are configured to reliably attach to a planar surface such, as for example, a surface of a solar panel, such as by using vacuum. In a suction cup embodiment, the suction cups can be actuated by pushing the cup against the planar surface, thereby pushing out the air from the cup and creating a vacuum seal with the planar surface. As a consequence the planar surface adheres to the suction cup with an adhesion strength that is dependent on the size of the suction cup and the integrity of the seal with the planar surface. In some embodiments, an air inlet (not shown) provides air onto the planar surface when the planar surface is sealed to the suction cup so as to deactivate the vacuum and release the planar surface from the suction cup.

The system may further include a linear guide assembly 106 coupled to the end of arm assembly tool 100. The linear guide assembly 106 includes a linearly movable clamping tool 108 with an engagement member 108-A configured to engage a clamp assembly coupled to an installation structure. The linear guide assembly 106 can be actuated to move the clamping tool 108 along an axis between, for example, an extended position and a retracted position. The axis of movement of the clamping tool 108 may be parallel to an axis of the installation structure. Thus, the linear guide assembly 106 can move the clamping tool 108 and the engagement member 108-A along the installation structure.

Figure 6B:
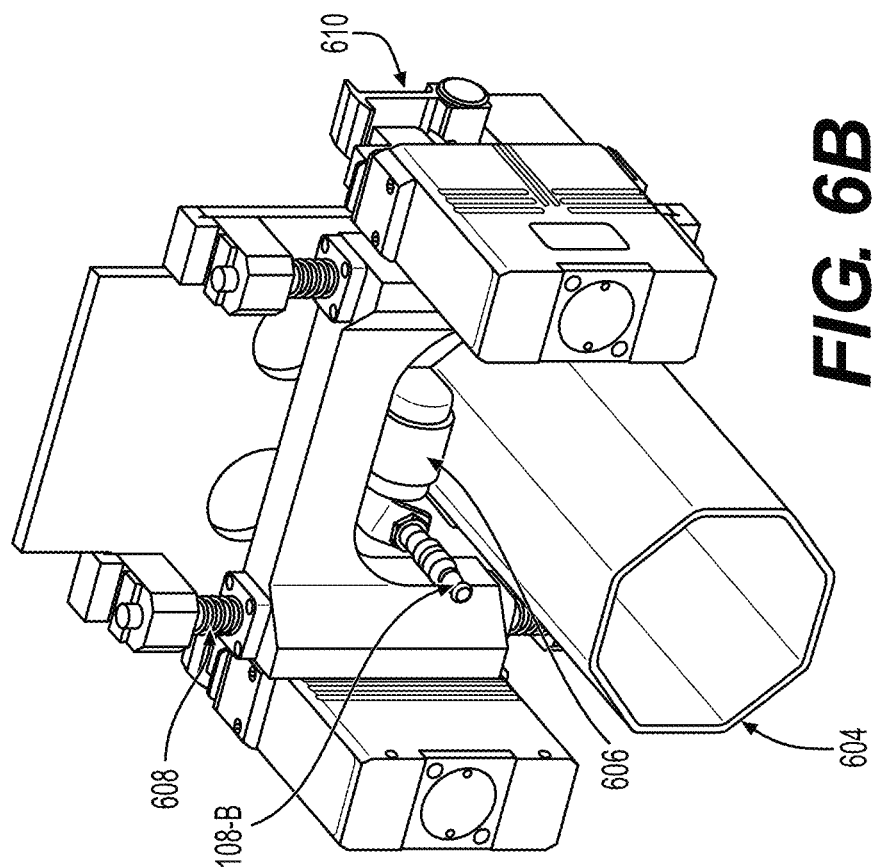
FIGS. 6A and 6B show perspective views of the clamping tool of a solar panel handling system in engagement with a clamp assembly coupled to an installation structure, in accordance with an embodiment of the present disclosure.
Figure 6A:
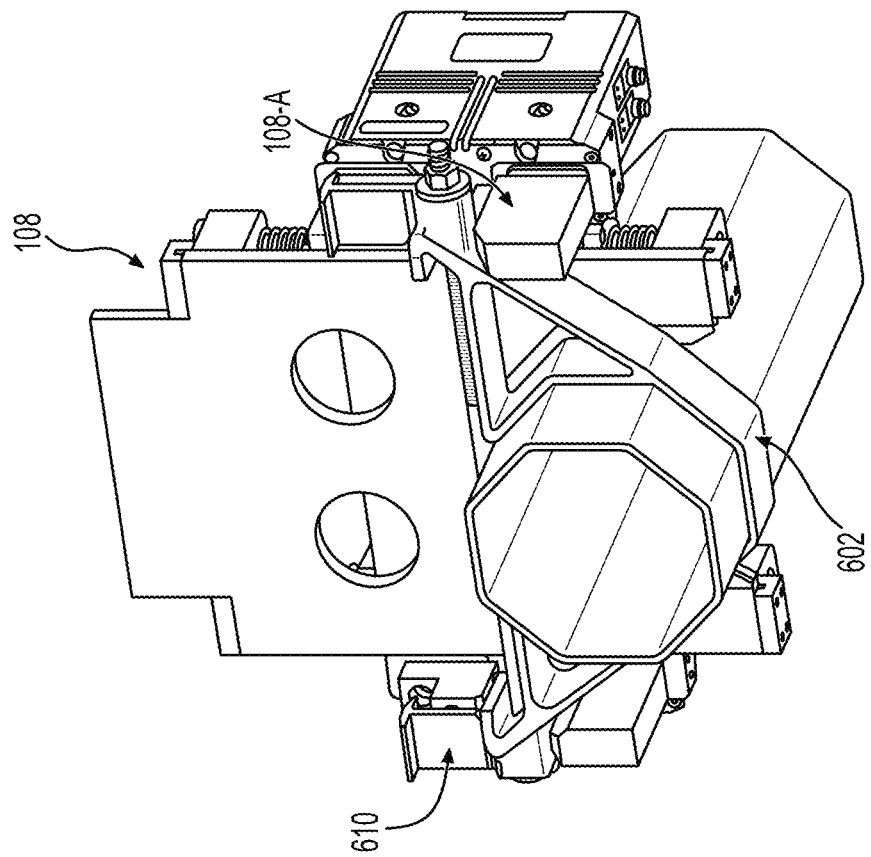

In some embodiments, the engagement member 108-A may include electromagnets which may be actuated to grasp a clamp assembly 602 (see FIGS. 6A, 6B). Alternatively, or additionally, the engagement member 108-A may include a gripper to prevent disengagement between the clamp assembly 602 and the engagement member 108-A when the linear guide assembly 106 is actuated to move the clamping tool relative to the installation structure as described in more detail elsewhere herein.

The linear guide assembly 106 is actuated using a force torque transducer 110. In some embodiments, the linear guide assembly 106 and the force torque transducer 110 may form a rack and pinion structure such that the rotation of the force torque transducer 110 results in advancement or retraction of the clamping tool 108. In some embodiments, the linear guide assembly 106 may be a hydraulic assembly including a telescoping shaft coupled to the clamping tool 108. In such embodiments, the force torque transducer 110 may be configured in the form of a pump for pumping a hydraulic fluid. In other embodiments, the force torque transducer 110 may be configured in the form of or coupled to a liner drive motor that engages a surface of the telescoping shaft coupled to the clamping tool 108.

In some embodiments, the linear guide assembly 106 may include an electric rod actuator to move the clamping tool 108 parallel to an axis of the installation structure.

In some embodiments, the guide assembly 106 may include a roller 606 to facilitate the movement of the clamping tool 108 along the installation structure 604. The roller may, for example, include a bearing or other components designed for reducing friction while the clamping tool 108 moves relative to the installation structure. The roller may be coupled with a sensor, such as by a force sensor or rotation sensor, to provide feedback to a controller.

In some embodiments, the guide assemble may include a spring mechanism 608 that enables small amounts of tilting (up to 15 degrees of tilt) of the clamping tool 108 relative to the installation structure 604. Such tilting may occur when the orientation assembly 804 tilts the end of arm assembly tool 100 relative to the installation structure 604 in order to appropriately level the solar panel.

The system may further include a junction box 112 coupled to the frame 102. The junction box 112 may include a controller configured to control the force torque transducer 110 and the attachment devices 104. In some embodiments, the junction box 112 may also include a power supply or a power controller for controlling the power supply to various components.

In some embodiments, the controller 112 may include a processor operationally coupled to a memory. The controller 112 may receive inputs from sensors associated with the solar panel handling system (e.g., an optical sensor or a proximity sensor 108-B described elsewhere herein). The controller 112 may then process the received signals and output a control command for controlling one or more components (e.g., the linear guide assembly 106, the clamping tool 108, or the attachment devices 104). For example, in some embodiments, the controller 112 may receive a signal from a proximity sensor determining that the clamp assembly is approaching a trailing edge of a solar panel being installed and accordingly reduce the speed of the linear guide assembly 106 to reduce excessive forces and impacts on the solar panel.

Figure 8:
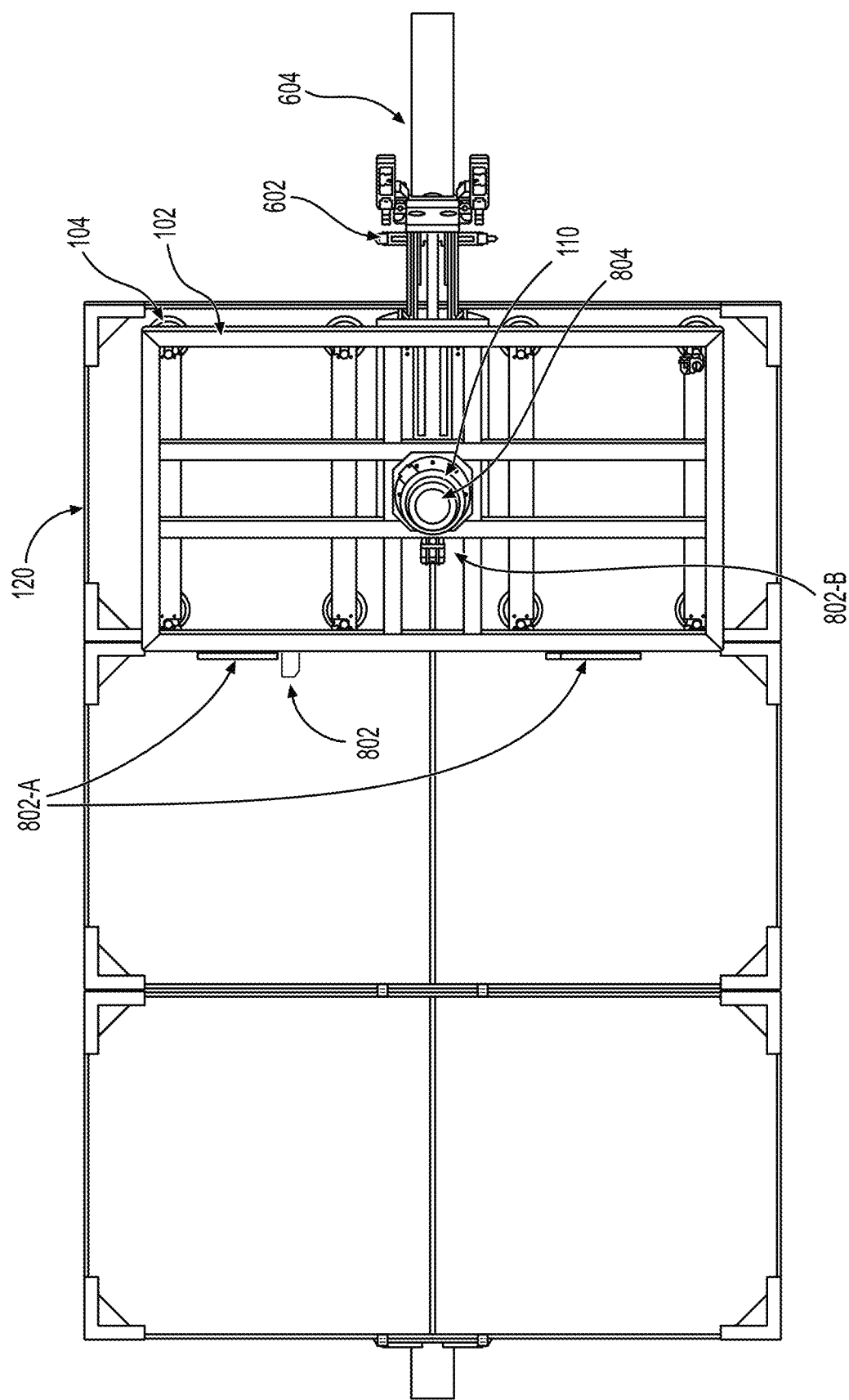
FIG. 8 schematically illustrates, in an overhead view, the solar panel handling system during the process of installing a solar panel, in accordance with an embodiment of the present disclosure.

Referring to FIG. 8, in some embodiments, the solar panel handling system may further include an optical sensor 802 such as, for example, a camera, a photodetector, or any other optical imaging or light sensing device. The optical sensor is suitably located on the frame 102, for example, at an outer or lower surface of an edge member indicated by position 802-A in FIG. 8, or at an interior location of the frame 102 that has a field of view that includes the leading edge of the solar panel, such as indicated by position 802-B in FIG. 8. The optical sensor may be configured to sense an orientation of the solar panel relative to the installation structure during the operation of the end of arm assembly tool. In some embodiments, the optical sensor may be configured in the form of one or more light guided levels (not shown). In such embodiments, one or more light beams (e.g., laser beams) may be projected along or parallel to the axis of the installation structure 604 from one end of the end of arm assembly tool 100, such as first locations on the frame 102. One or more photodetectors may be positioned at another end of the end of arm assembly tool 100, such as second locations on the frame 102, so as to detect the one or more laser beams. Thus, if the solar panel 120 being installed is not appropriately oriented or properly level relative to the installation structure 604, the solar panel 120 may obstruct the some or all of one or more laser beams resulting in varying signals from the one or more photodetectors, indicating that the solar panel 120 is not appropriately oriented or properly level relative to the installation structure 604.

In some embodiments, one or more sensors, such as optical sensors 802, may be used to detect and recognize objects to position and control the installation with improved accuracy. The sensor(s) may be implemented together with a neural network of, for example, an artificial intelligence (AI) system. For example, a neural network can include acquiring and correcting images related to the solar panel handling system, the solar panels (both installed and to be installed), and the installation environment (both natural environment, such as topography, and installed equipment, such as structures related to the solar panel array). Also, for example, a neural network can include acquiring and correcting positional or proximity information. The corrected images and/or the corrected positional or proximity information are input into the neural network and processed to estimate movement and positioning of equipment of the solar panel handling system, such as that related to autonomous vehicles, storage vehicles, robotic equipment, and installation equipment. The estimated movement and positioning are published to a control system associated with the individual equipment of the solar panel handling system or to a master controller for the solar panel handling system as a whole.

In some embodiments, the signal from the optical sensor may be input to the controller. In some embodiments, the solar panel handling system may further include an orientation assembly 804 (see FIG. 8) configured to tilt the end of arm assembly tool 100 relative to the installation structure 604. In such embodiments, the controller 112 may control the orientation in response to an input from the optical signal indicating that the solar panel being installed is not appropriately oriented or properly level relative to the installation structure, such as a torque tube 604. It will be appreciated that while the orientation assembly 804 is shown as being coupled to the force torque transducer 110, those of ordinary skill in the art will readily recognize other means of implementing the orientation assembly 804.

In some embodiments, the controller 112 may also be configured to control the attachment devices 104 so as to activate or deactivate the attachment/detachment thereof. For embodiments in which the attachment devices 104 are suction cups, a vacuum can enable coupling or release of the solar panels 120 with the end of arm assembly tool 100.

In some embodiments, the installation structure 604 may have an octagonal cross-section, as shown, e.g., in FIGS. 6A, 6B, and 7A-7D, to form a torque tube preventing inadvertent slipping of the clamp assembly 602. However, other cross-sectional shapes may be used, such as squared, oval, or other shape. Further, the installation structure 604 may use a circular cross-sectional shapes.

Figure 9:
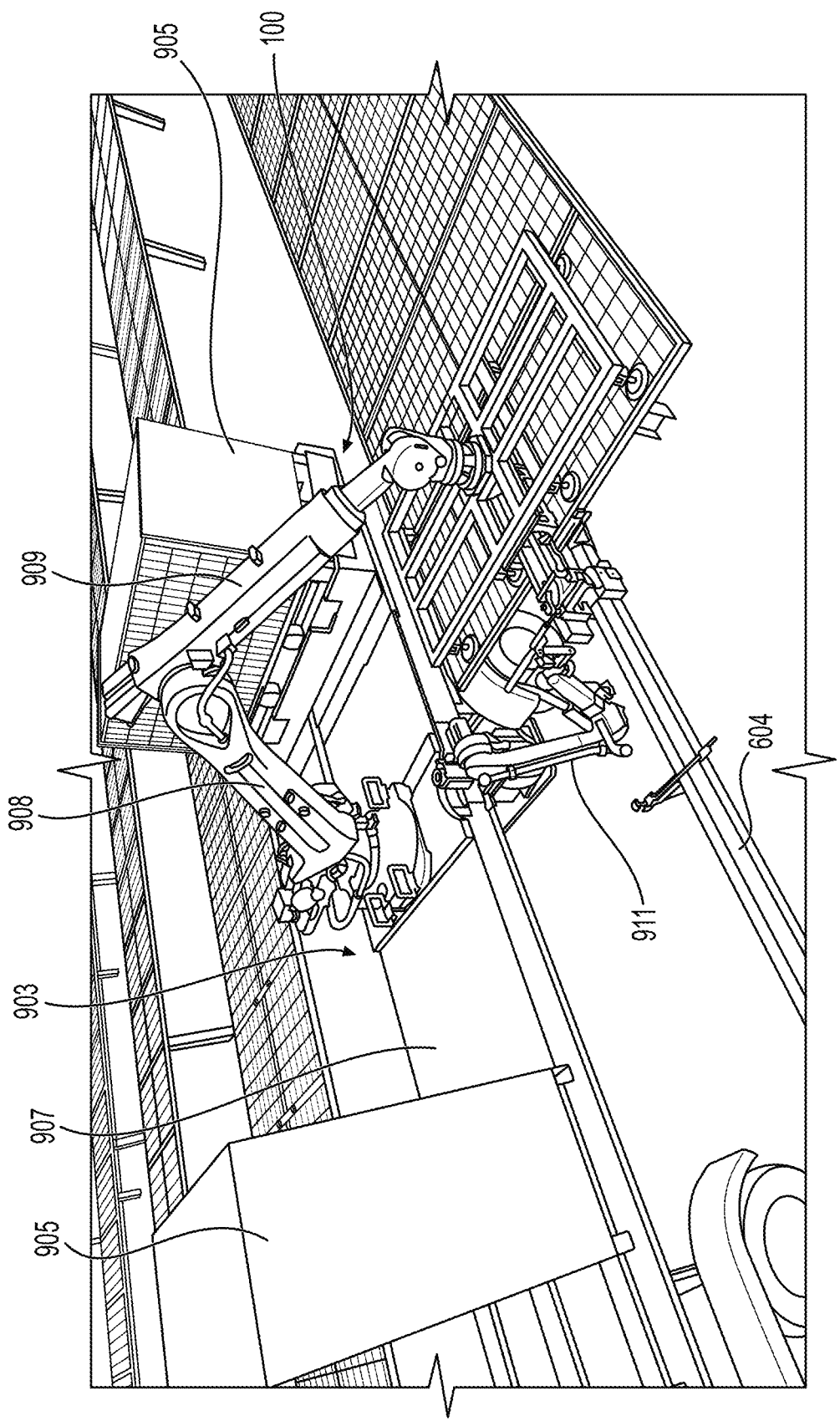
FIG. 9 illustrates the solar panel handling system including the assembly tool coupled with an assembly moving robot using a robotic arm.
Figure 10:
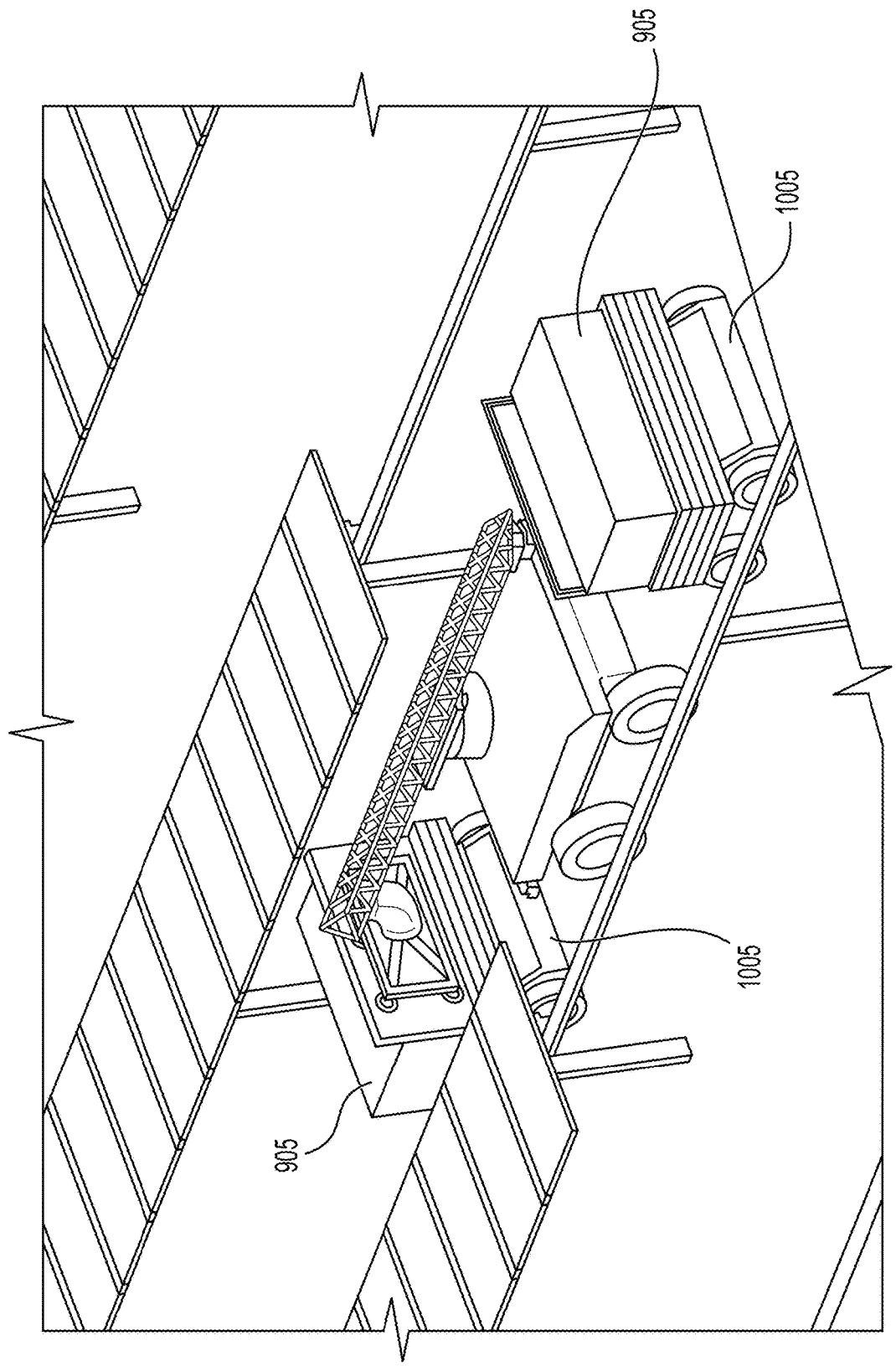
FIG. 10 illustrates the solar panel handling system having two robotic arms in which two assembly tools are coupled with an assembly moving robot using respective robotic arms.

In some embodiments, the assembly tool 100 may be configured to couple with an assembly moving robot 903 (an example of which is shown in FIGS. 9 and 10). The assembly moving robot 903 may be configured to position the end of the arm assembly tool 100 relative to a stack or storage container 905 of solar panels, move a selected solar panel and position the selected solar panel relative to the installation structure 604. In some embodiments, the assembly moving robot 903 may be operationally coupled with the end of arm assembly tool 100 via the force transducer 110 (or where applicable, the orientation assembly 804). In some embodiments, the assembly moving robot may also be operationally coupled to the controller, enabling an operator of the assembly moving robot to control the various functions of the end of arm assembly tool 100, such as, for example, activation and/or deactivation of the attachment devices 104, advancement and/or retraction of the clamping tool, and/or activation and/or deactivation of the engagement member relative to the clamp assembly.

Referring now to FIGS. 1, 6A, 6B, 7A-7D, 9, and 10, in operation, a solar panel 120 is obtained and positioned over the installation structure 604. The solar panel is then tilted relative to the installation structure 604 so that a leading edge of the solar panel (i.e., an edge that will be adjacent an edge of the previously installed solar panel or, for a first solar panel, an edge that will be adjacent a stop affixed to the installation structure 604) is oriented closer to the installation structure 604 than an opposite, trailing edge. The leading edge is then placed in a receiving channel (either a receiving channel positioned along the edge of the previously installed solar panel, i.e. as part of a clamp assembly, or a receiving channel in the stop) and the tilt of the solar panel reduced to an installed position on the installation structure. The tilt angle is reduced while the solar panel is biased into the receiving channel so that in the installed position the edge region of the top planar surface of the solar panel (i.e., the photovoltaicly active surface that is oriented to the sun) is captured within the receiving channel. An example embodiment of a receiving channel 610 on a clamp assembly 602 is shown in FIGS. 6A and 6B.

Once the solar panel is in position on the installation structure, the force torque actuator 110 actuates the guide assembly 106 of the end of arm assembly tool 100 to contact the engagement member 108-A of the clamping tool 108 with a clamp assembly 602. This clamp assembly was originally positioned on the installation structure outside the area to be occupied by the solar panel being installed, but also sufficiently close so as to be reached by the relevant components of the end of arm assembly tool 100. Surfaces and features of the engagement member 108-A may be located and sized so as to mate with complimentary features on the clamp assembly 602. After this contact, the force torque actuator 110 is actuated (either continued to be actuated or actuated in a second mode) to axially slide the clamp assembly 602 along a portion of the length of the installation structure 604. Axially sliding of the clamp assembly 602 engages a receiving channel of the clamp assembly 602 with the trailing edge of the just installed solar panel. Sensors, such as in the force torque actuator 110 or in the clamping tool 108, can provide feedback to the controller indicating full engagement of the receiving channel of the clamp assembly 602 with the trailing edge of the solar panel. Once the clamp assembly 602 is positioned, the guide assembly 106 is retracted and installation of the next solar panel can occur.

In some embodiments, the linear guide assembly 106 may include a proximity sensor 108-B configured to sense a distance between the engagement member 108 and the trailing edge of the solar panel 120 during an operation of installation of the solar panel 120. An output from the proximity sensor 108-B may be used to suitably control the speed of the clamping tool 108 during the operation of linear guide assembly 106 so as to avoid excessive forces and impacts on the solar panel 120. In some embodiments, the proximity sensor 108-B may be, for example, an optical or an audio sensor (e.g., sonar) that detects a distance between the leading edge of the solar panel 120 and the engagement member 108; in other embodiments, the proximity sensor 108-B may be a limit switch that is retracted by contact.

With further reference to FIGS. 9 and 10, the assembly moving robot 903 may be implemented using a ground vehicle 907. For example, the ground vehicle 907 may be implemented as an electric vehicle (EV). The ground vehicle 907 may autonomously move adjacent to the installation structure 604. While not shown, the ground vehicle 907 may move along a track or a rail that is attached to or separate from the installation structure. In some embodiments, the ground vehicle 907 may be controlled using sensors or be controlled based on input or feedback from sensors. The sensors can be, for example, optical sensors or proximity sensors. In further embodiments, a neural network using artificial intelligence may be used in controlling movement of the ground vehicle 907, such as by analyzing the operating environment and developing instructions for movement and of the ground vehicle.

FIG. 10 illustrates an embodiment of a solar panel handling system having two robotic arms in which two assembly tools are coupled with an assembly moving robot using respective robotic arms.

As shown FIG. 9, the storage container 905 containing the solar panels to be installed may be disposed on the ground vehicle. Here, FIG. 9 illustrates the solar panel handling system including an arm assembly tool 100 coupled with an assembly moving robot using a robotic arm. Alternatively, as shown in FIG. 10, one or more storage containers 905 may be disposed on respective one or more of module vehicles 1005 adjacent to the ground vehicle 907. As such, FIG. 10 illustrates the solar panel handling system having two robotic arms in which two assembly tools are coupled with an assembly moving robot using respective robotic arms. In embodiments of the disclosure, the robotic arm(s) may be an articulated arm having two or more sections coupled with joints, or alternatively may be a truss arm. Illustrations herein are intended to disclose the use of any type of arm in accordance with the present disclosure.

In accordance with FIG. 9, for example, the robotic arm of the arm assembly tool 100 having an upper section 908 and a lower section 909 may offer increased flexibility in operation while maintaining light weight and simple operation. As additionally illustrated in FIG. 9, a second robotic arm 911 may be provided with the arm assembly tool 100 having a nut runner or nut driver at an end thereof to secure the solar panel to the installation structure 604. While any type of robotic arm may be used for the second robotic arm 911, FIG. 9 illustrates an example using an articulated arm with the nut runner or nut driver at an end thereof. Here, the robotic arms 100 and 911 may be autonomous operated using computer vision with a neural network and artificial intelligence control. Alternatively, the robotic arms 100 and 911 may be manually operated or remote control operated.

In some embodiments, the ground vehicle 907 may be an autonomous vehicle in which the neural network and artificial intelligence control the movement and operation and the module vehicles 1005 are towed or coupled to the ground vehicle 907. In other embodiments, the module vehicles 1005 may be an autonomous vehicle in which the neural network and artificial intelligence control the movement and operation and the ground vehicle 907 is towed or coupled to the module vehicles 1005 Also, in some embodiments, the assembly moving robot 903 is mounted on one of the ground vehicle 907 and the module vehicles 1005. In other embodiments, the assembly moving robot 903 can be mounted on a dedicated robot vehicle.

Figure 11B:
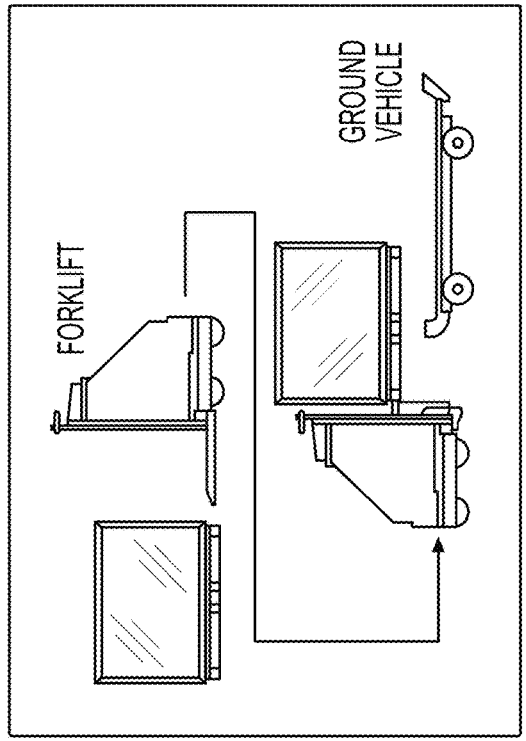
FIGS. 11A to 11C illustrate a process for installing the solar panels.
Figure 11A:
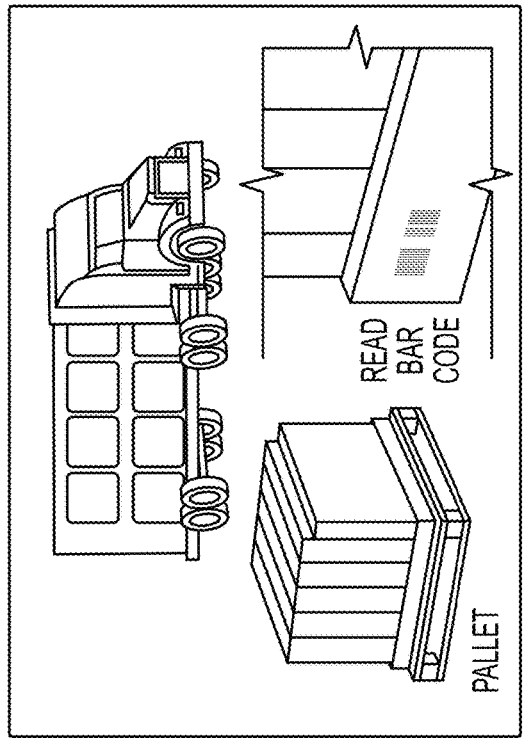
Figure 11C:
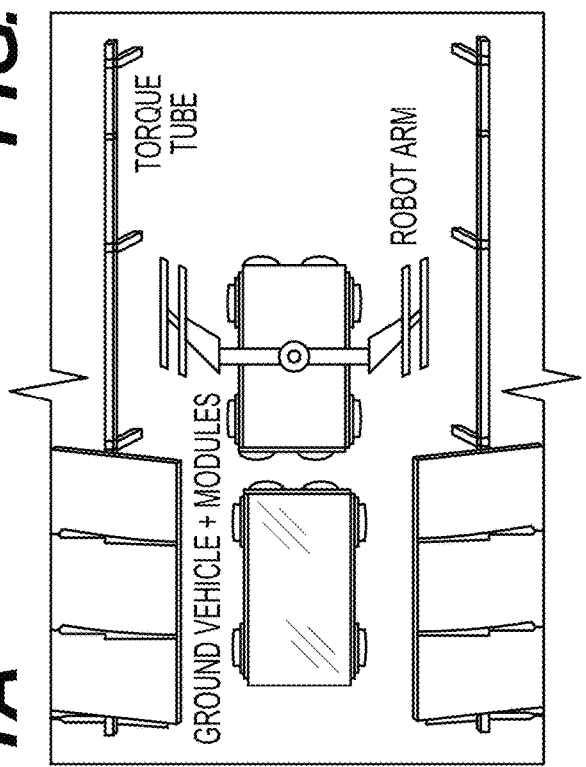

A process for installing the solar panels is shown in FIGS. 11A to 11C. As shown in FIG. 11A, a pallet of solar panels may be delivered via truck. In some embodiments, the pallet may compose the storage container 905 of solar panels. The pallet may include machine readable signage, such as a bar code, a QR-code, or other manufacturing reference, that can be read to provide information regarding the solar panels, the installation instructions or other information to be used in the installation process, particularly information to be used by the neural network and artificial intelligence control. Such information can include, for example, number of solar panels, the type of solar panels, physical characteristics of the solar panel such as size, characteristics related to installation, such as hardware type and location, installation instructions, or other characteristics of the solar panels, the storage of the solar panels on the pallet, and information related to installation. Further, using the machine readable signage, the system may control feeding or replenishing the panels boxes in the right order and/or to ensure panels with similar impedance from the factory are used.

As shown in FIG. 11B, mechanized equipment such as a forklift may be used to move and position the pallet on the ground vehicle. Here, the forklift may be manually operated, remotely operated, or autonomous. In FIG. 11B, the pallet is positioned on the ground vehicle. Alternatively, the pallet may be positioned on a module vehicle. Then, as shown in FIG. 11C, the arm of the robot is used to install the solar panels. In the illustrated example, two arms are used to handle respective solar panels to be installed on respective installation structures. Here, the ground vehicle moves between two respective installation structures. Further, one module vehicle is provided, which may be separated from the ground vehicle.

Figure 12A:
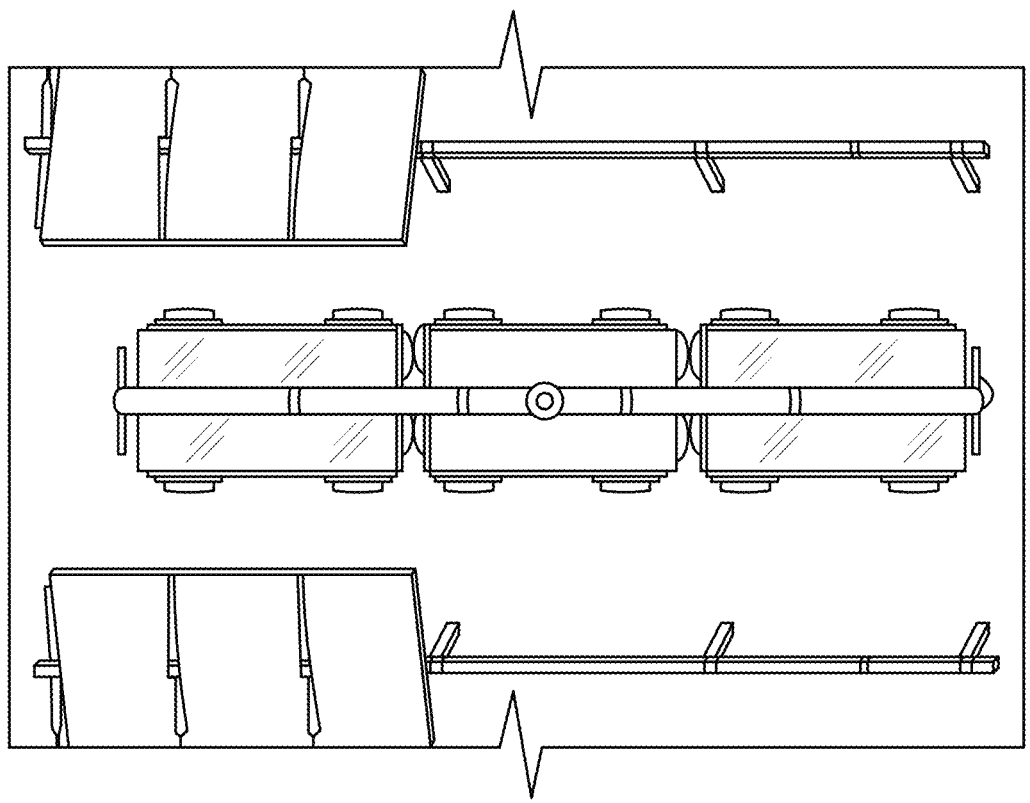
FIGS. 12A and 12B illustrate an arrangement for a moving robot system including two module vehicles and a ground vehicle having two robotic arms.
Figure 12B:
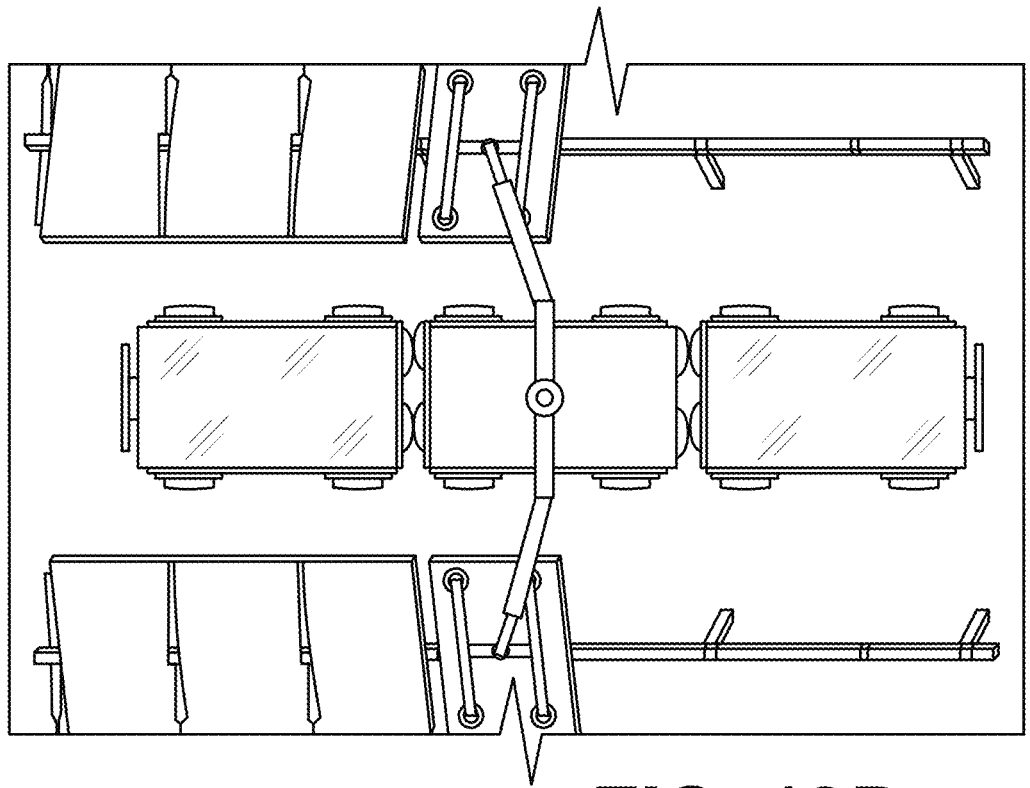

As one of ordinary skill in the art would recognize, modifications and variations in implementation may be used. For example, as shown in FIGS. 12A and 12B, two module vehicles may be provided for the respective robot arms. In a further alternative, the module vehicles may be connected with the ground vehicle instead of being separated. Thus, as shown in FIG. 12A, the robot arms may engage respective solar panels to be installed as illustrated in FIG. 12B.

Figure 13:
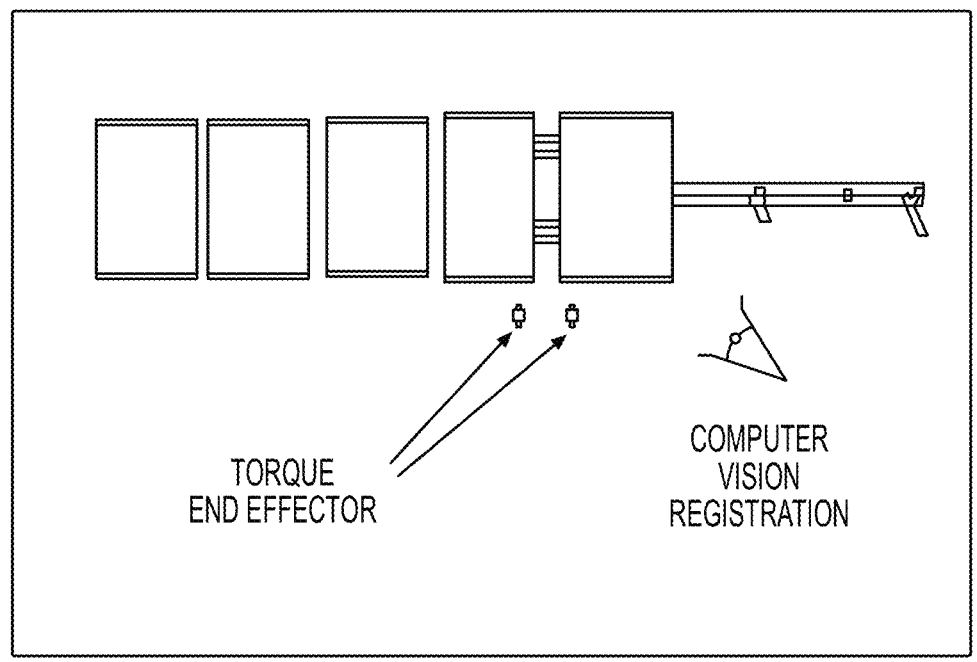
FIG. 13 schematically illustrates installation achieved using computer vision registration.

In some embodiments, as illustrated in FIG. 13, installation may be achieved using computer vision registration. For example, as mentioned above, optical sensors or the like may be utilized with a neural network for artificial intelligence.

Figure 14:
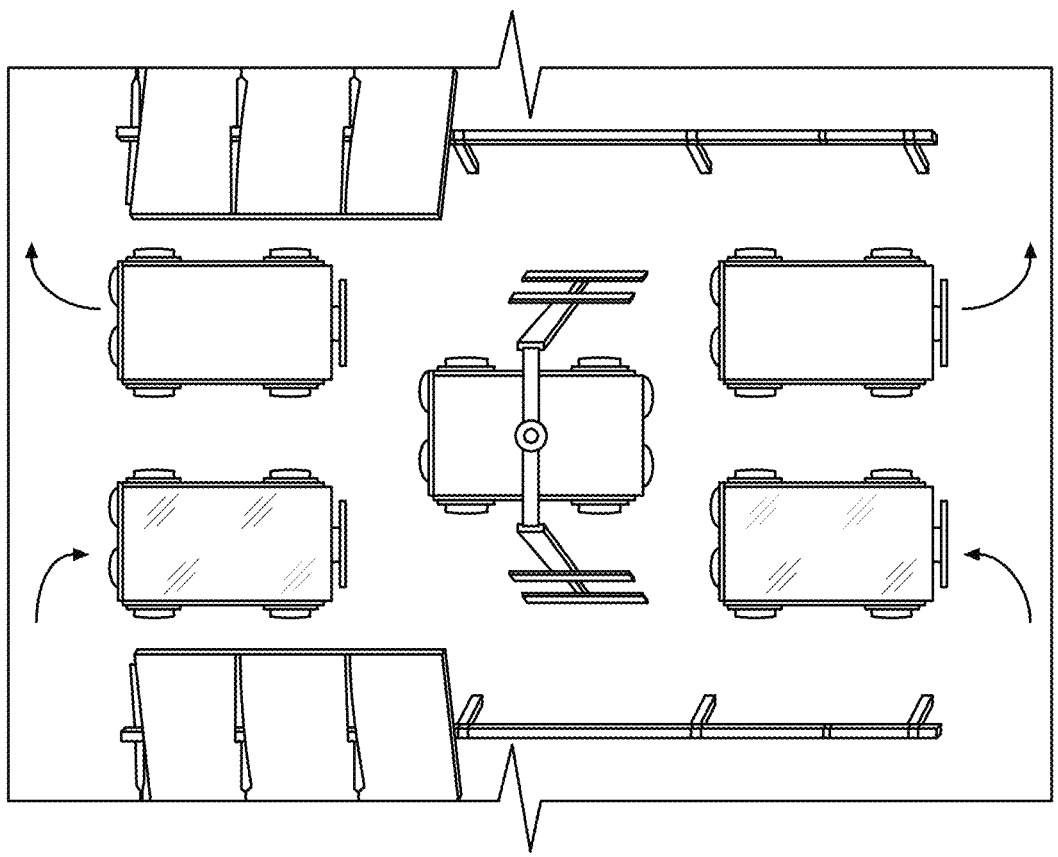
FIG. 14 schematically illustrates an arrangement wherein the module vehicles are exchanged with new module vehicles having additional solar panels for replenishment.
Figure 15:
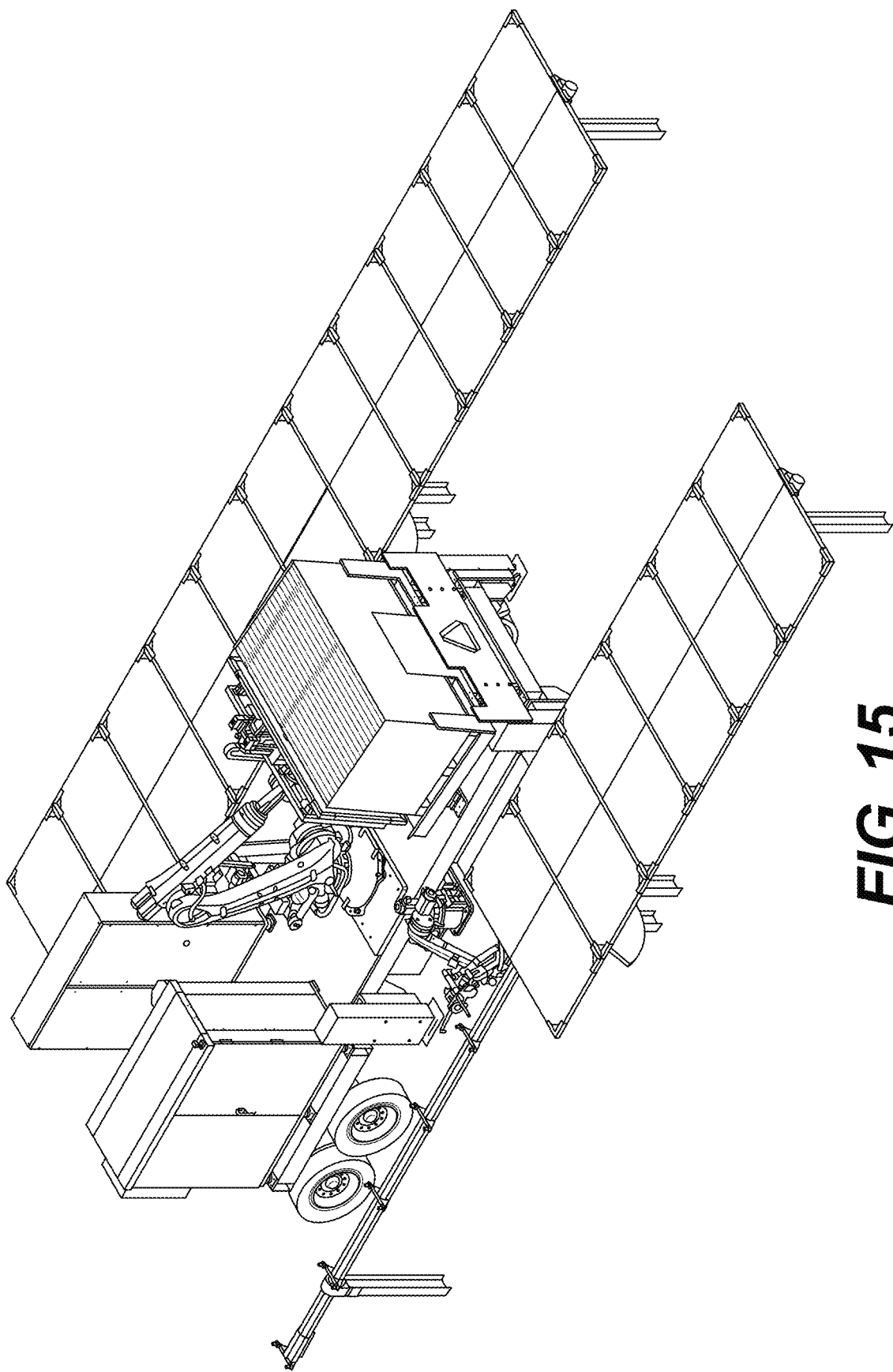
Figure 16:
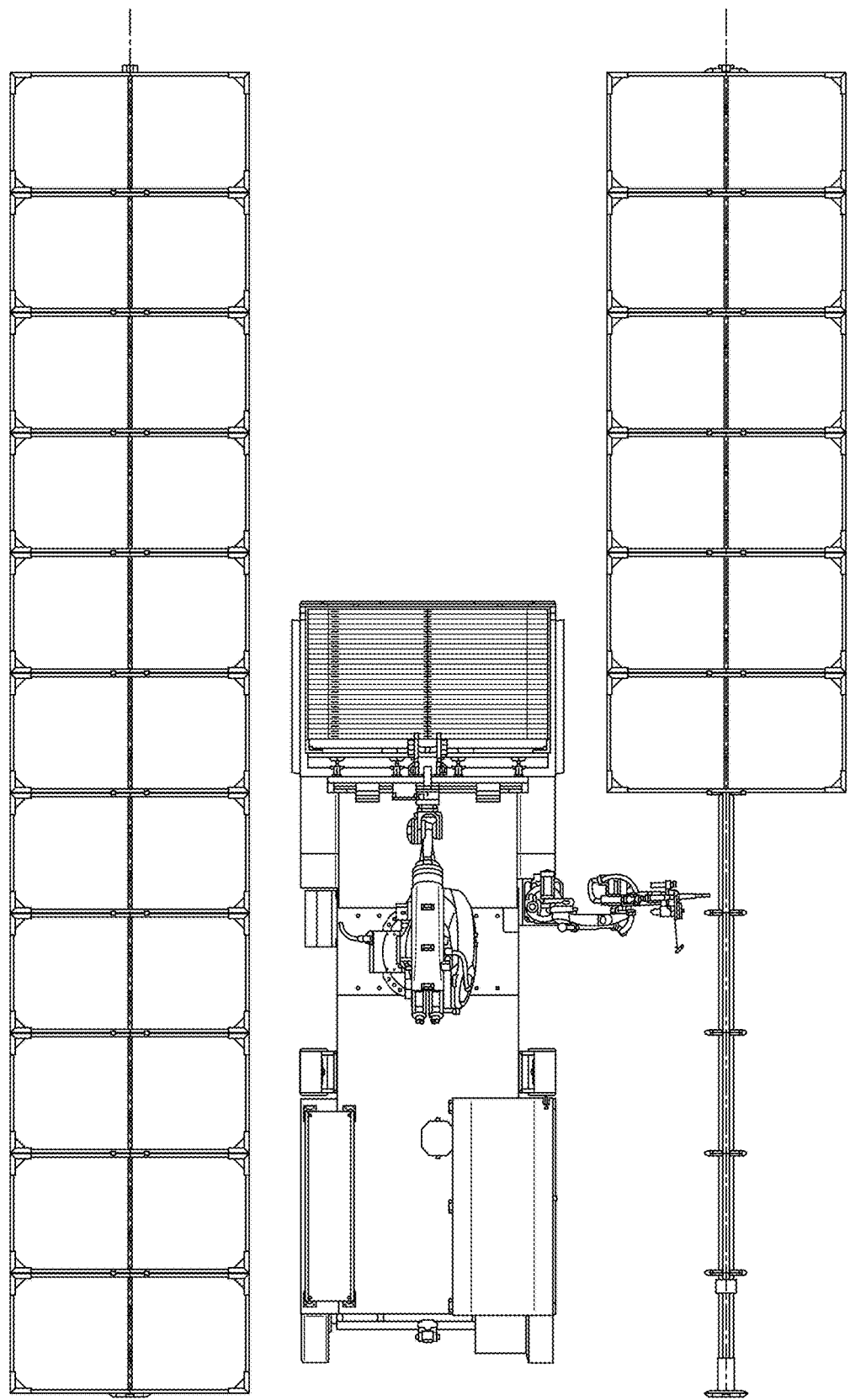
Figure 17:
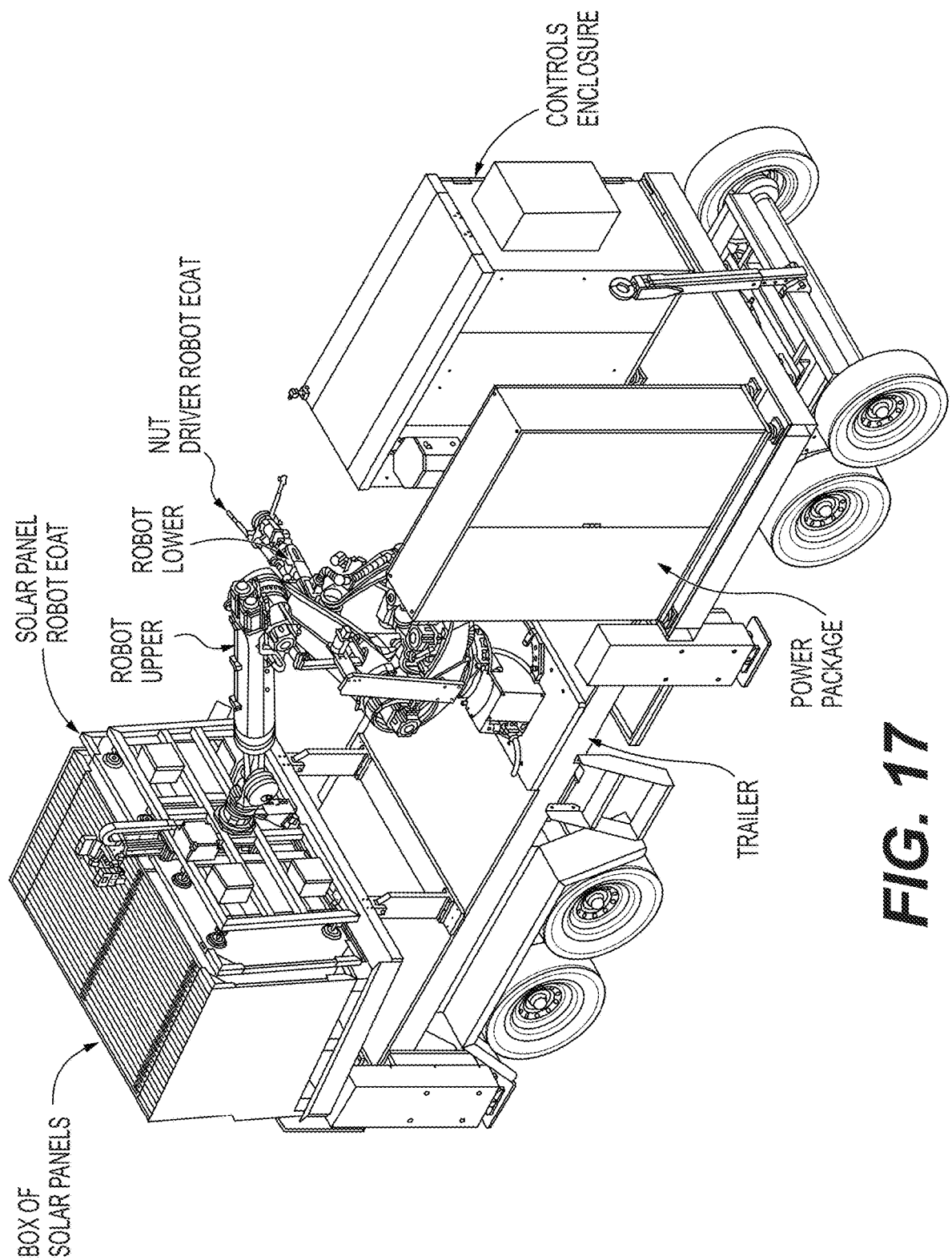
Figure 17:
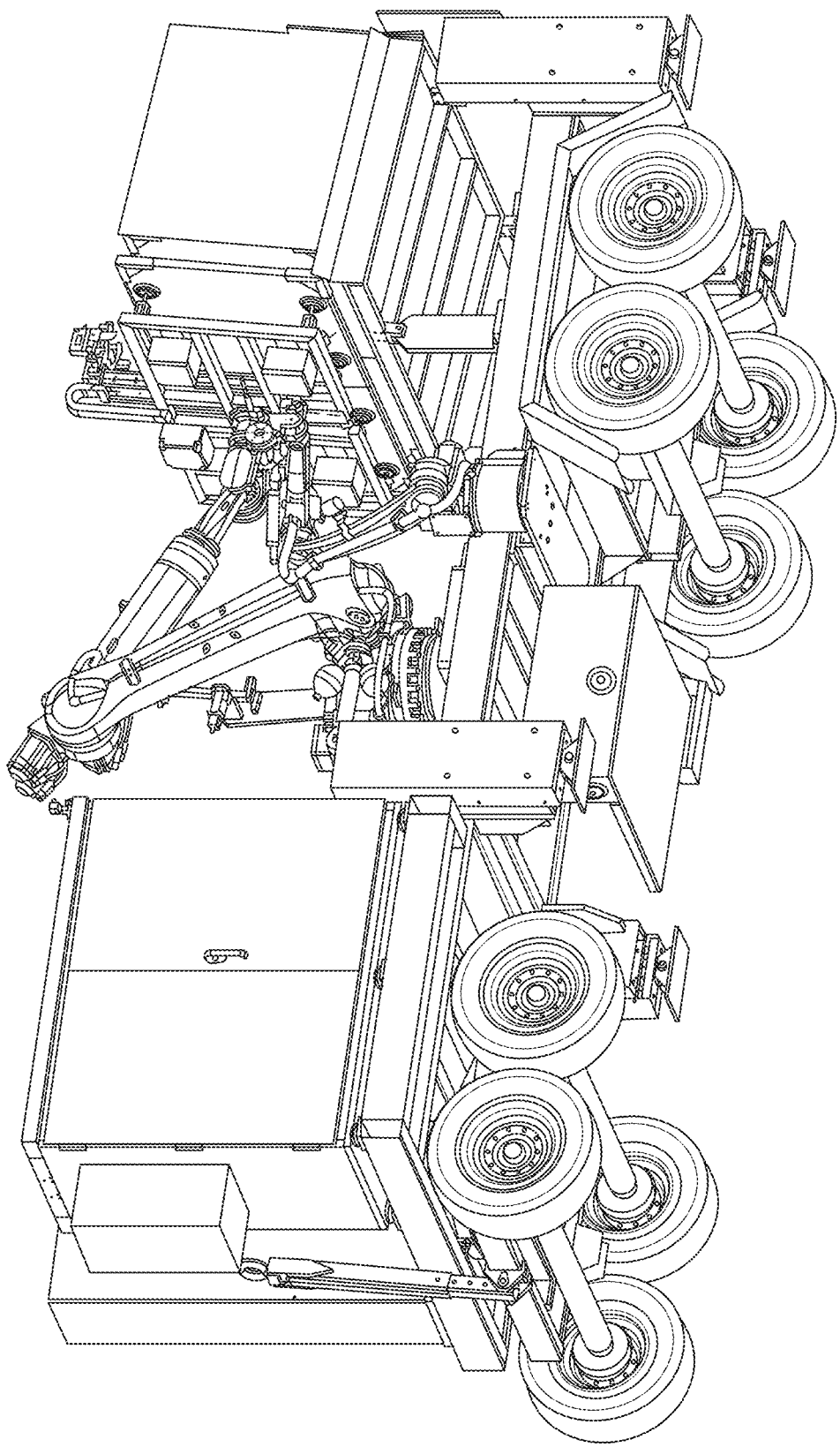
Figure 18:
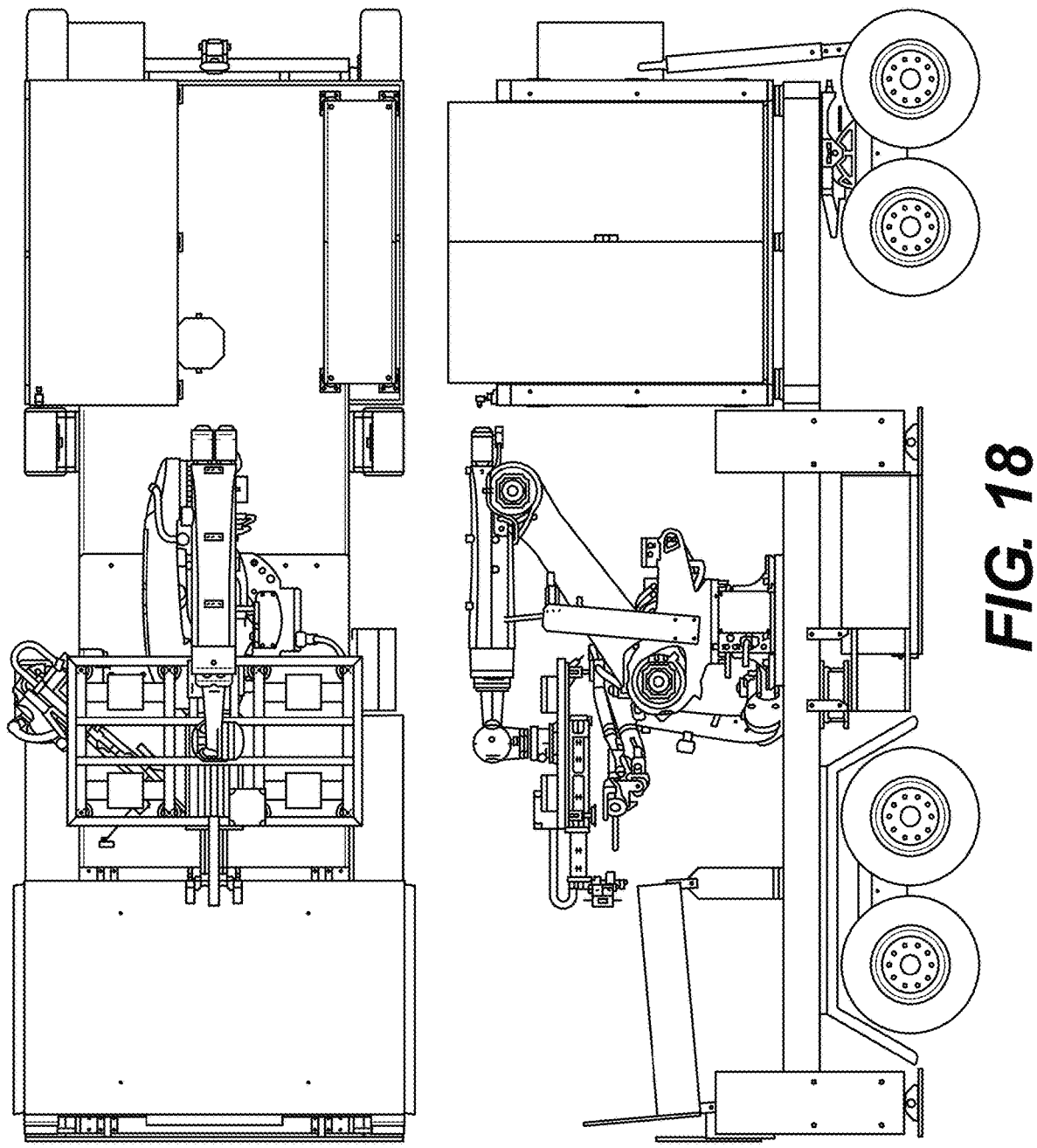
Figure 19:
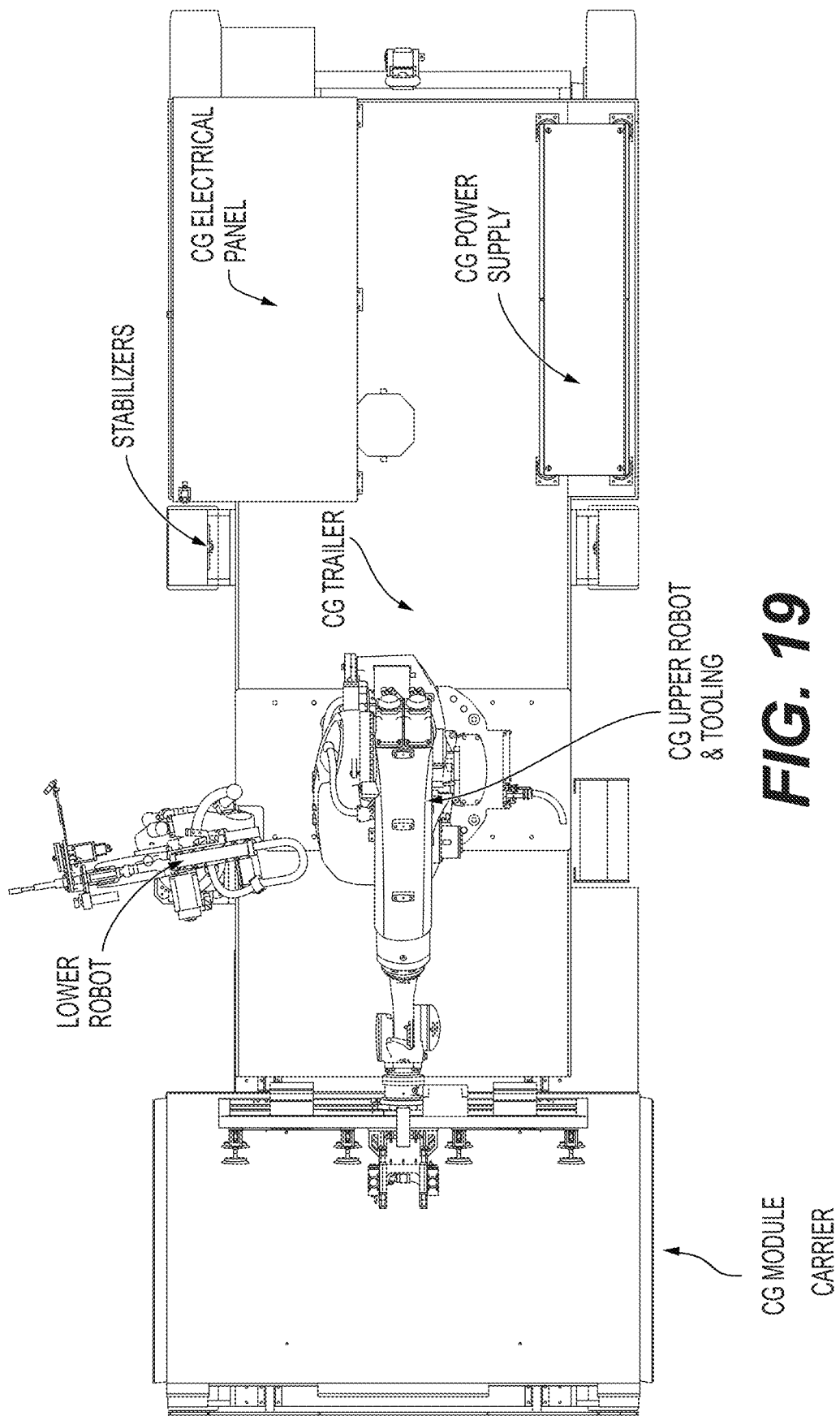
Figure 20:
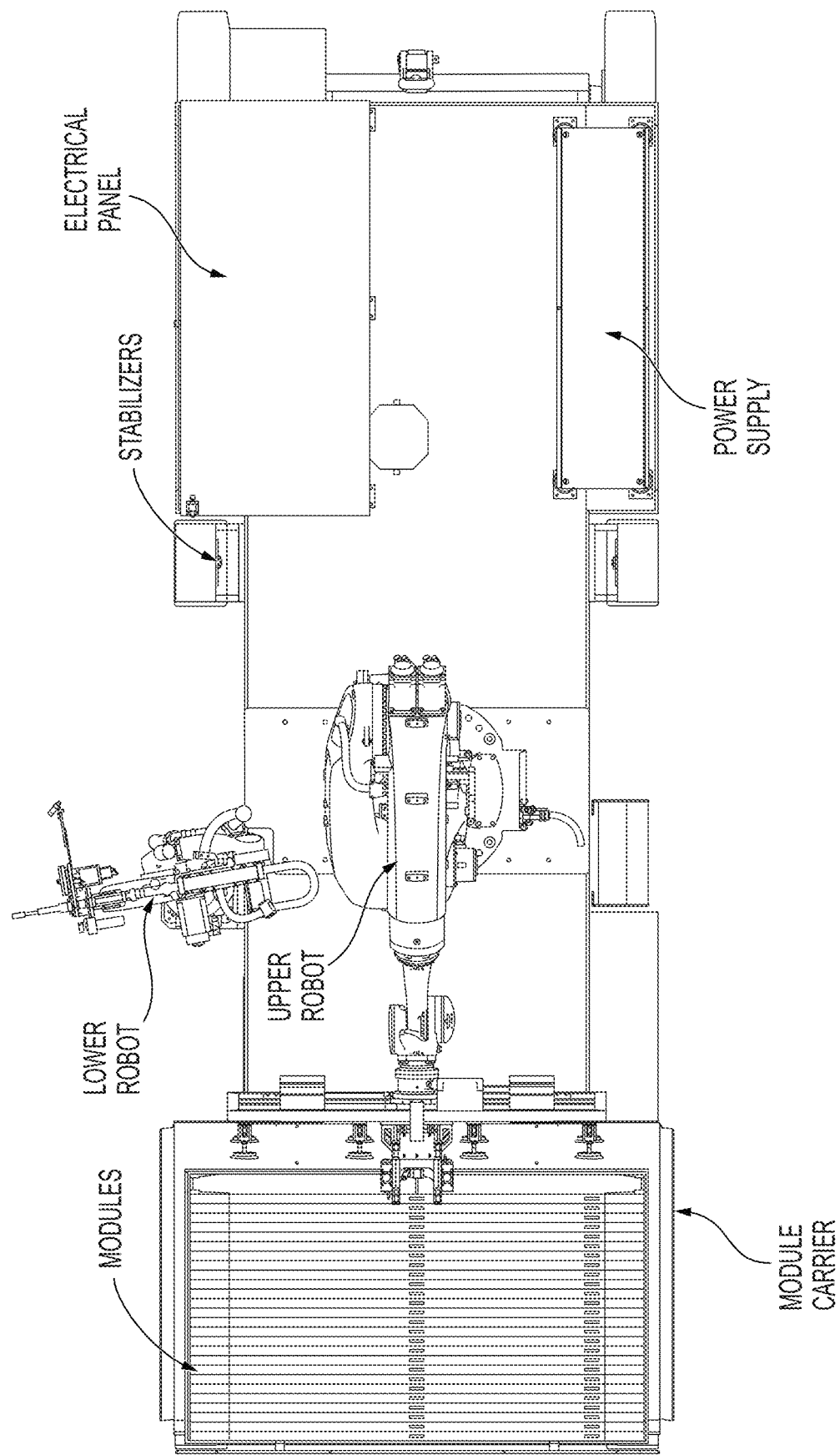
Figure 21:
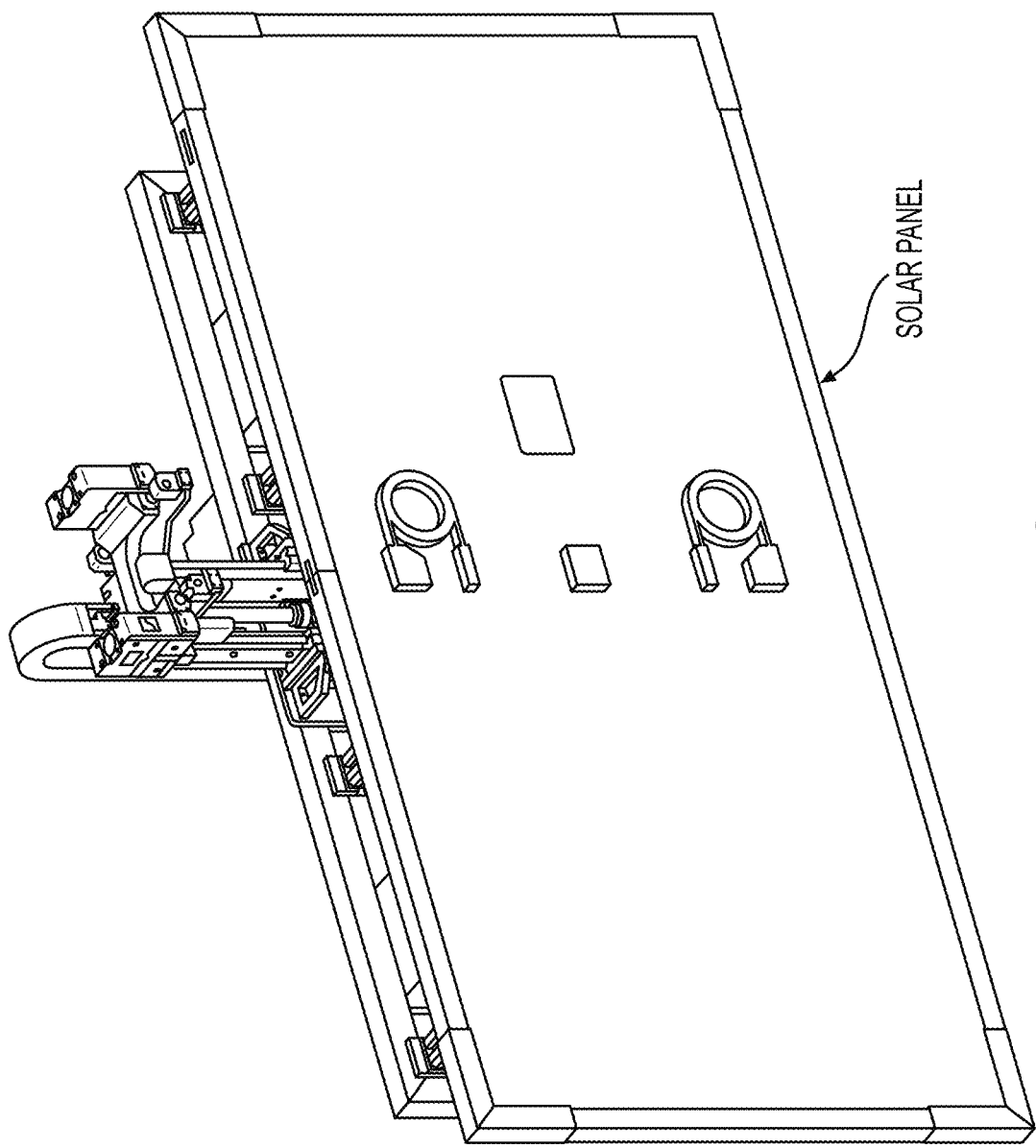
Figure 21:
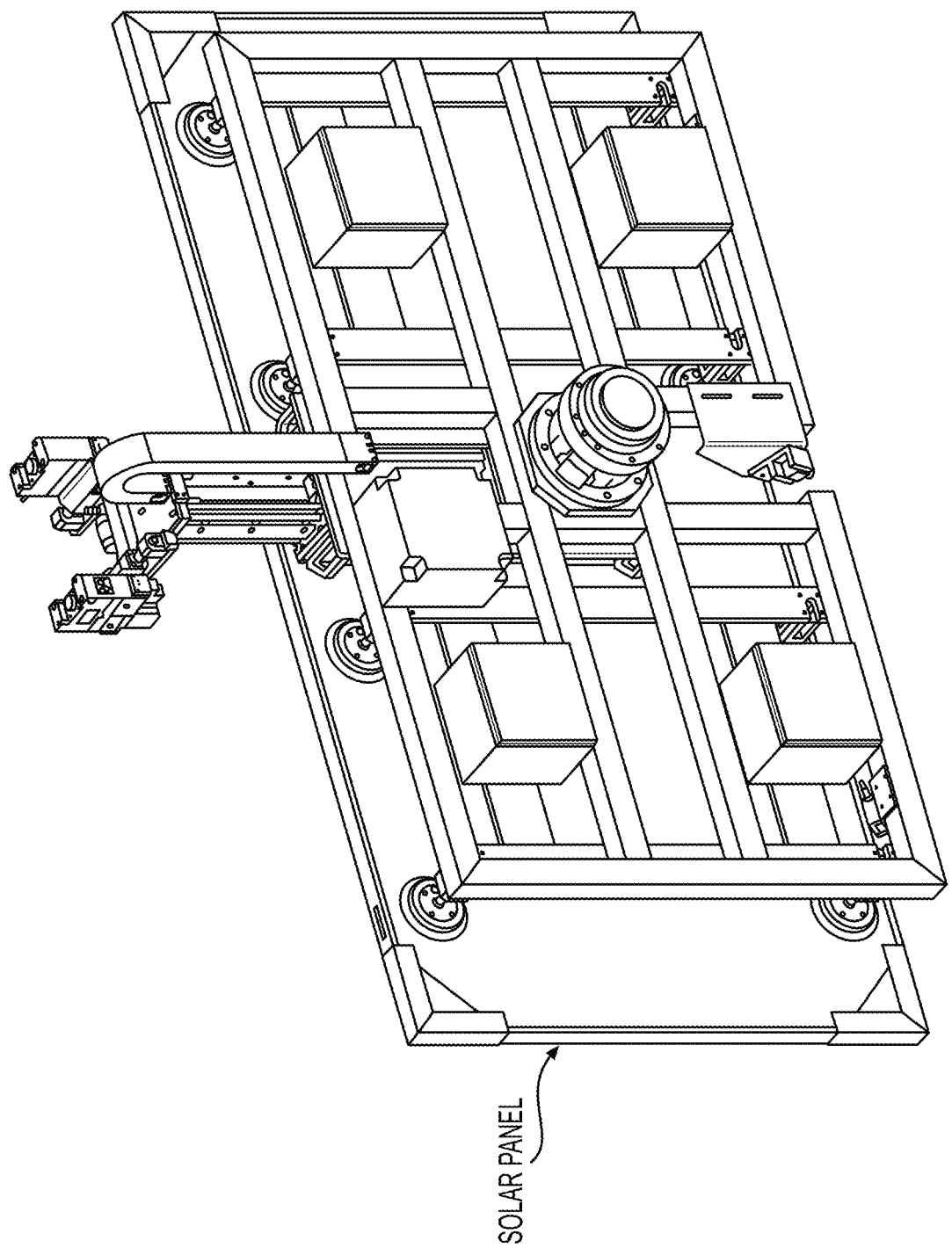
Figure 23:
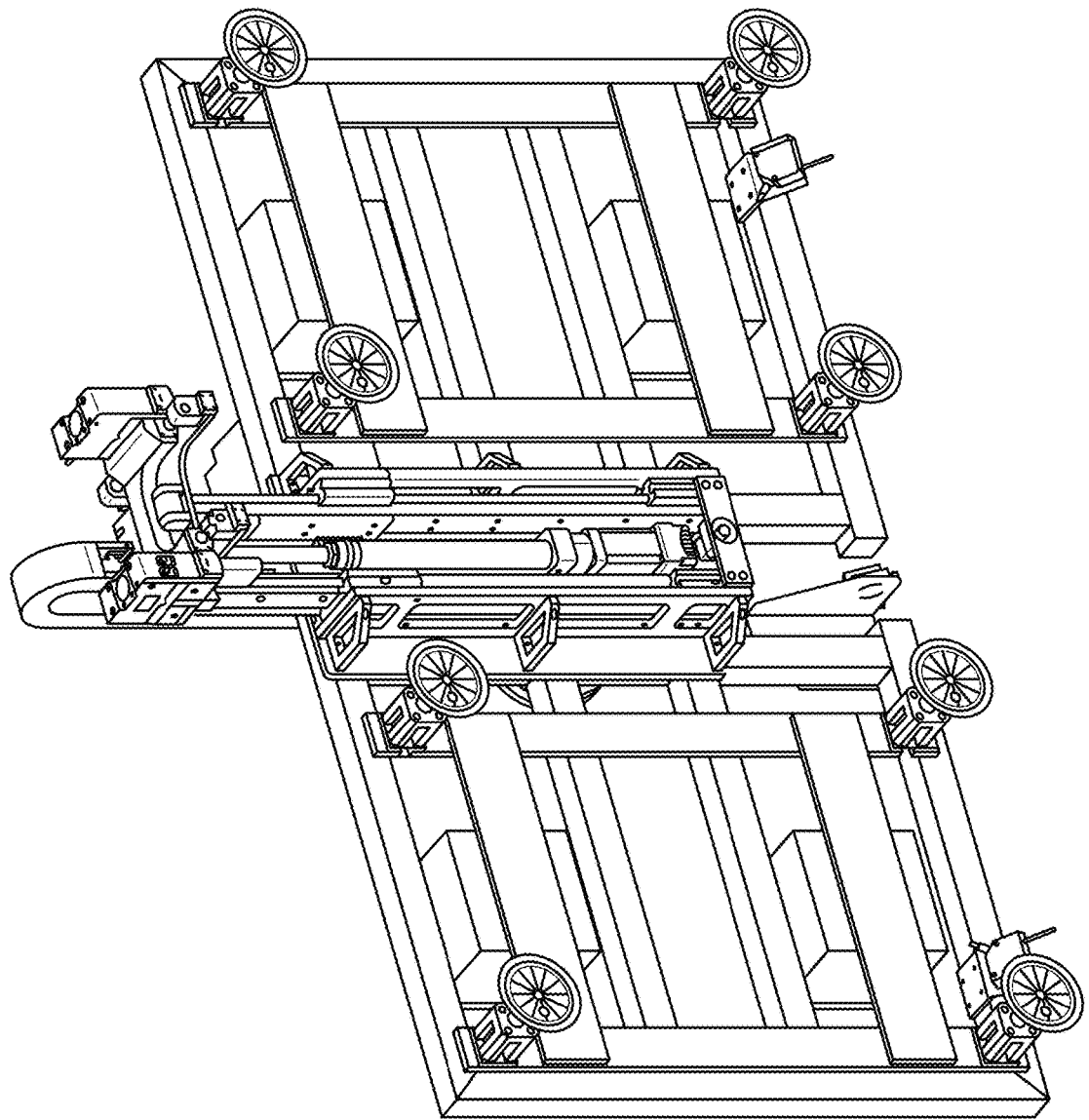
Figure 23:
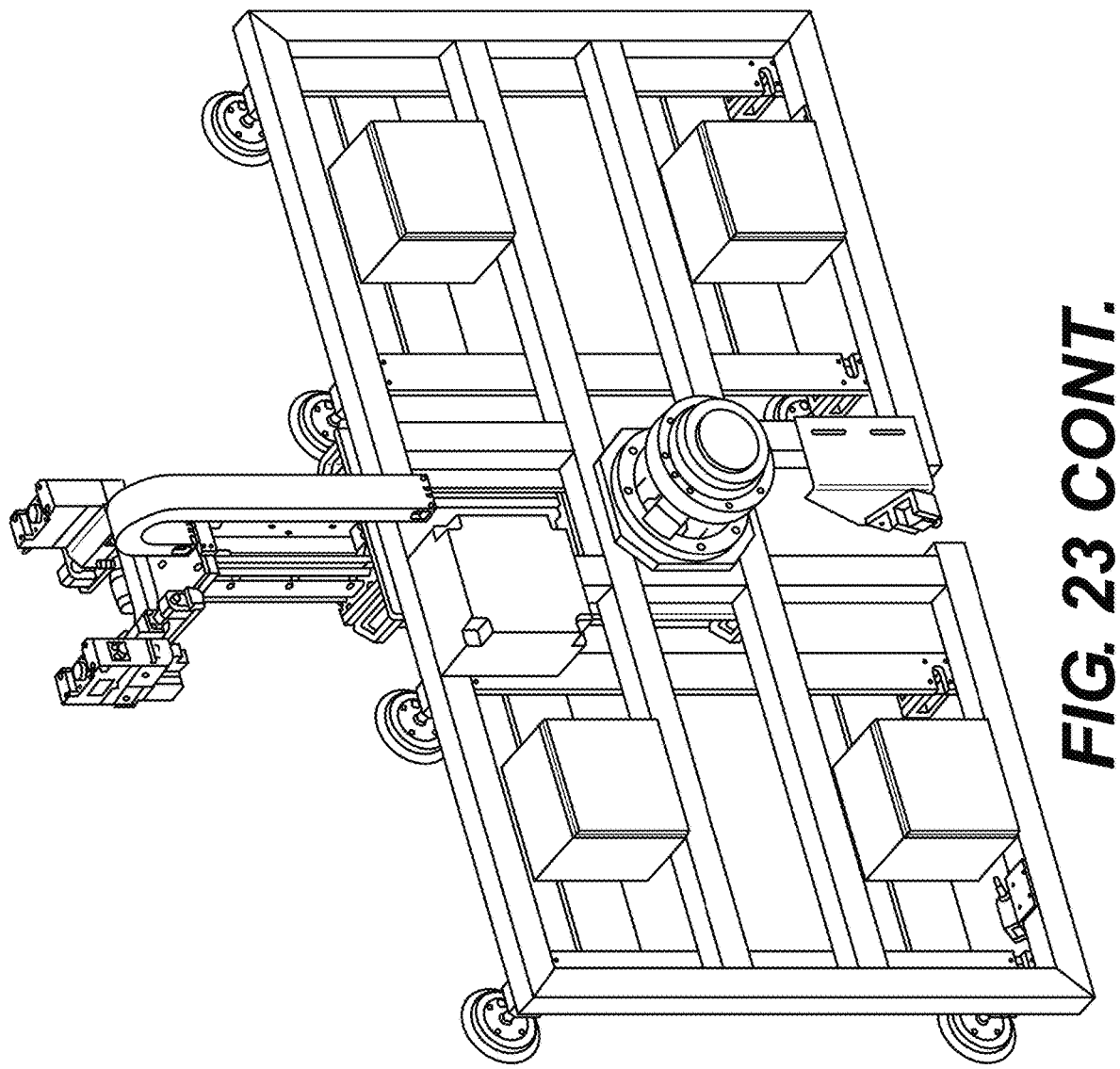
Figure 24:
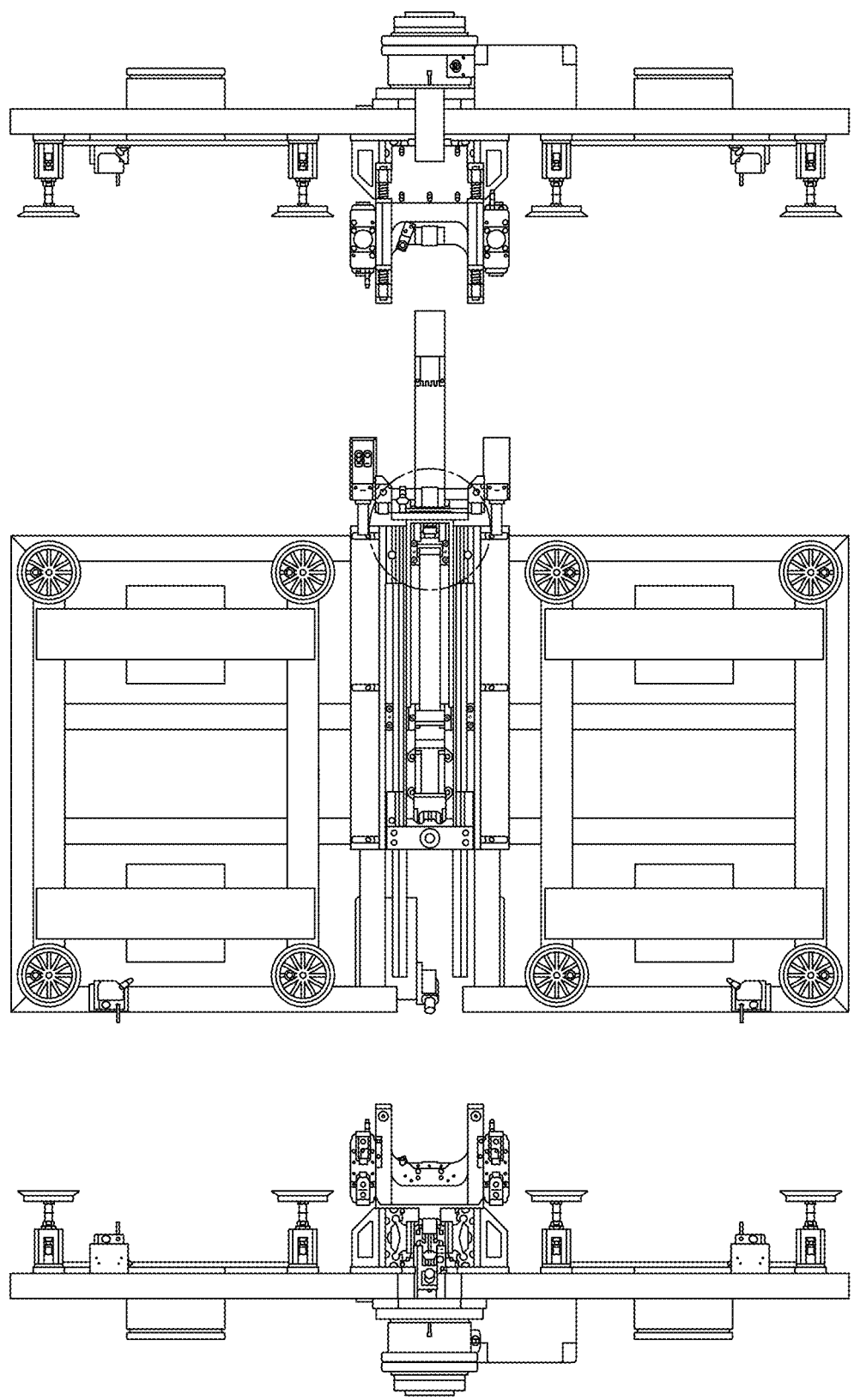
Figure 27:
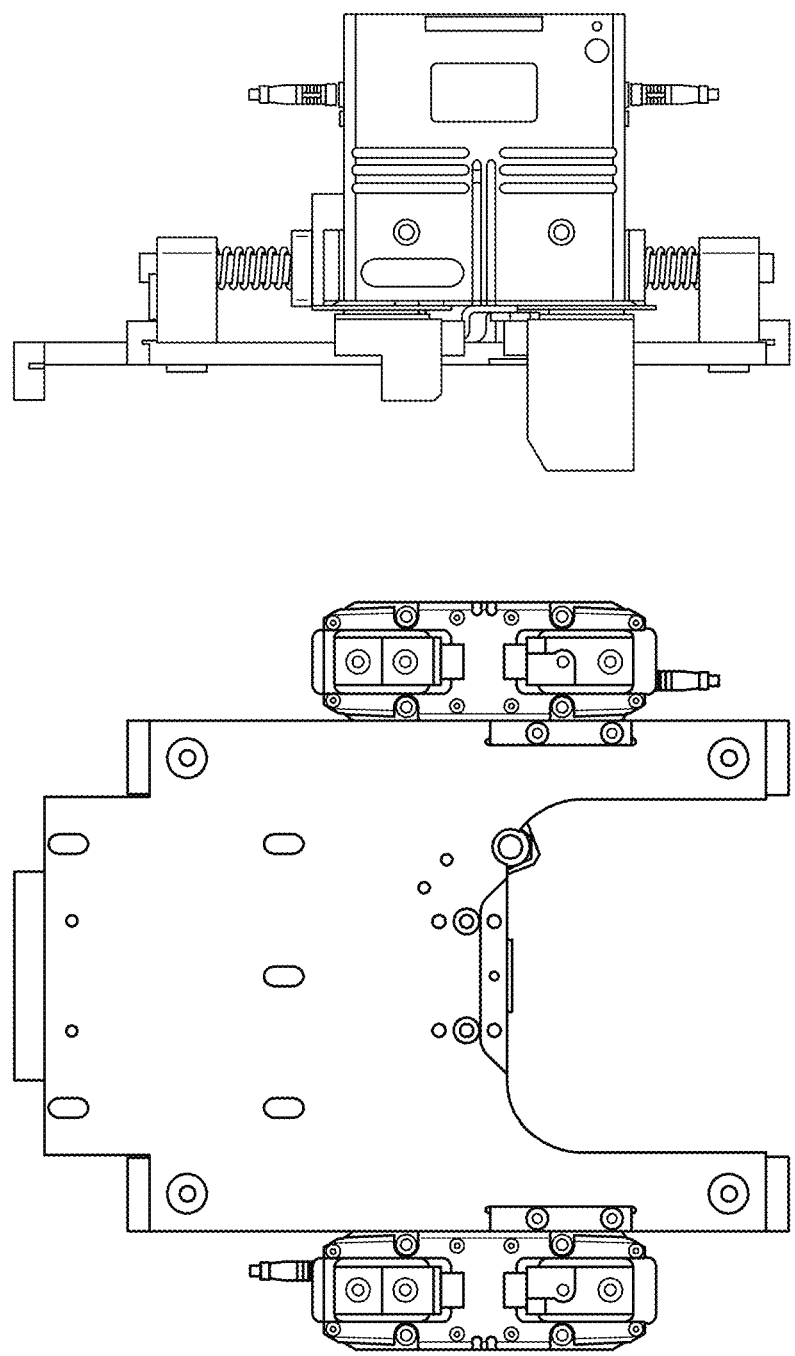
Figure 27:
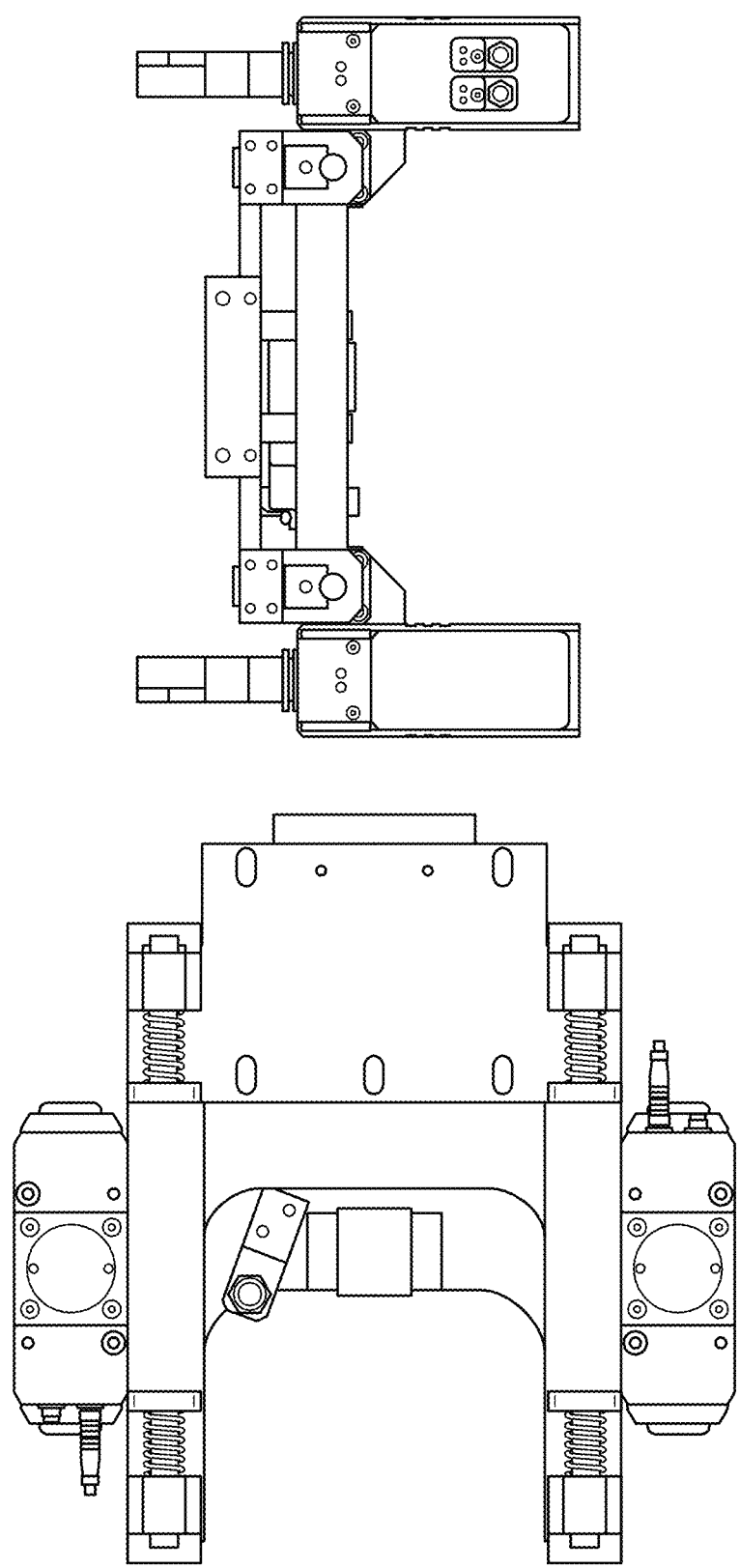
Figure 28:
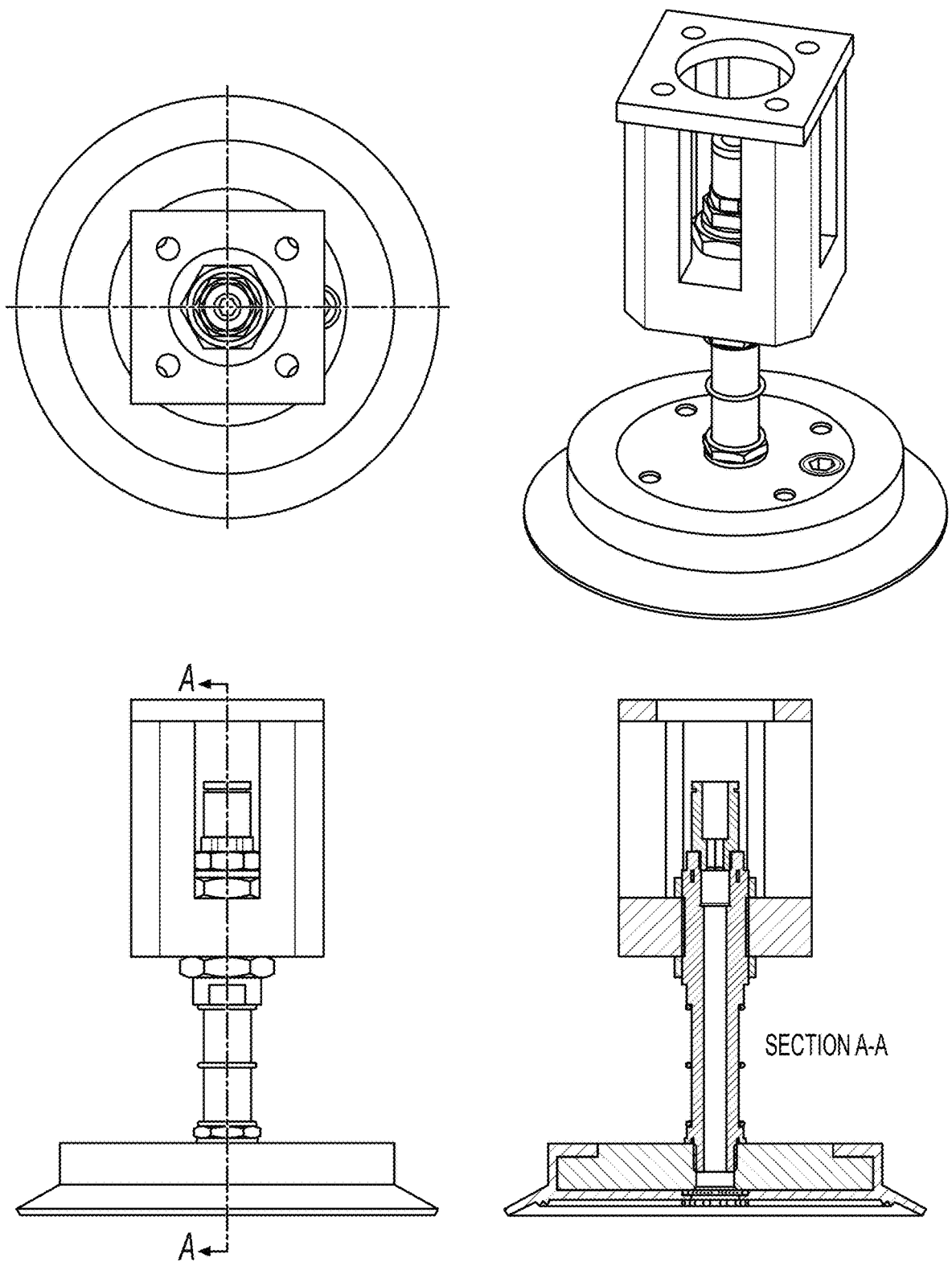
Figure 29:
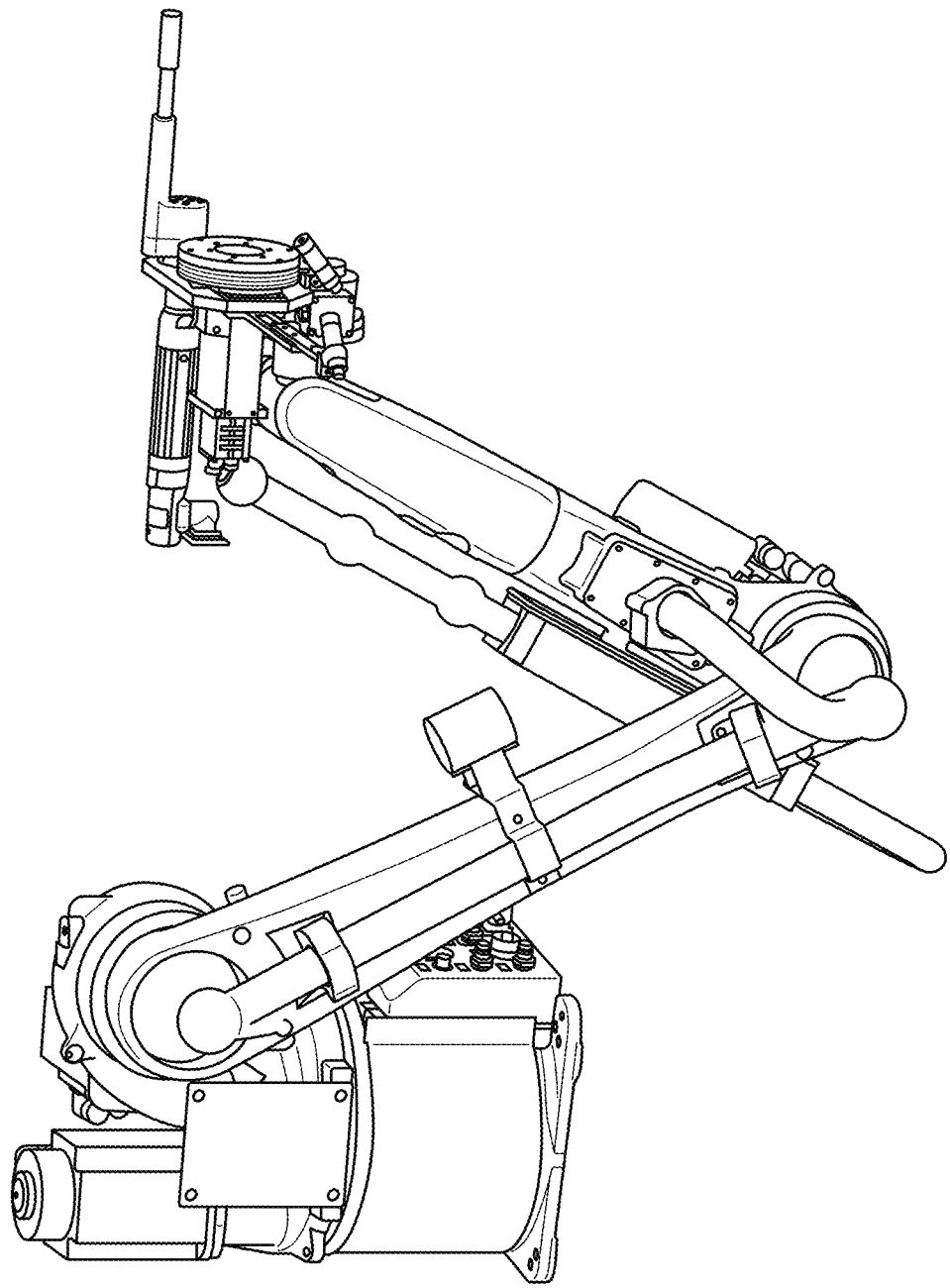
Figure 29:
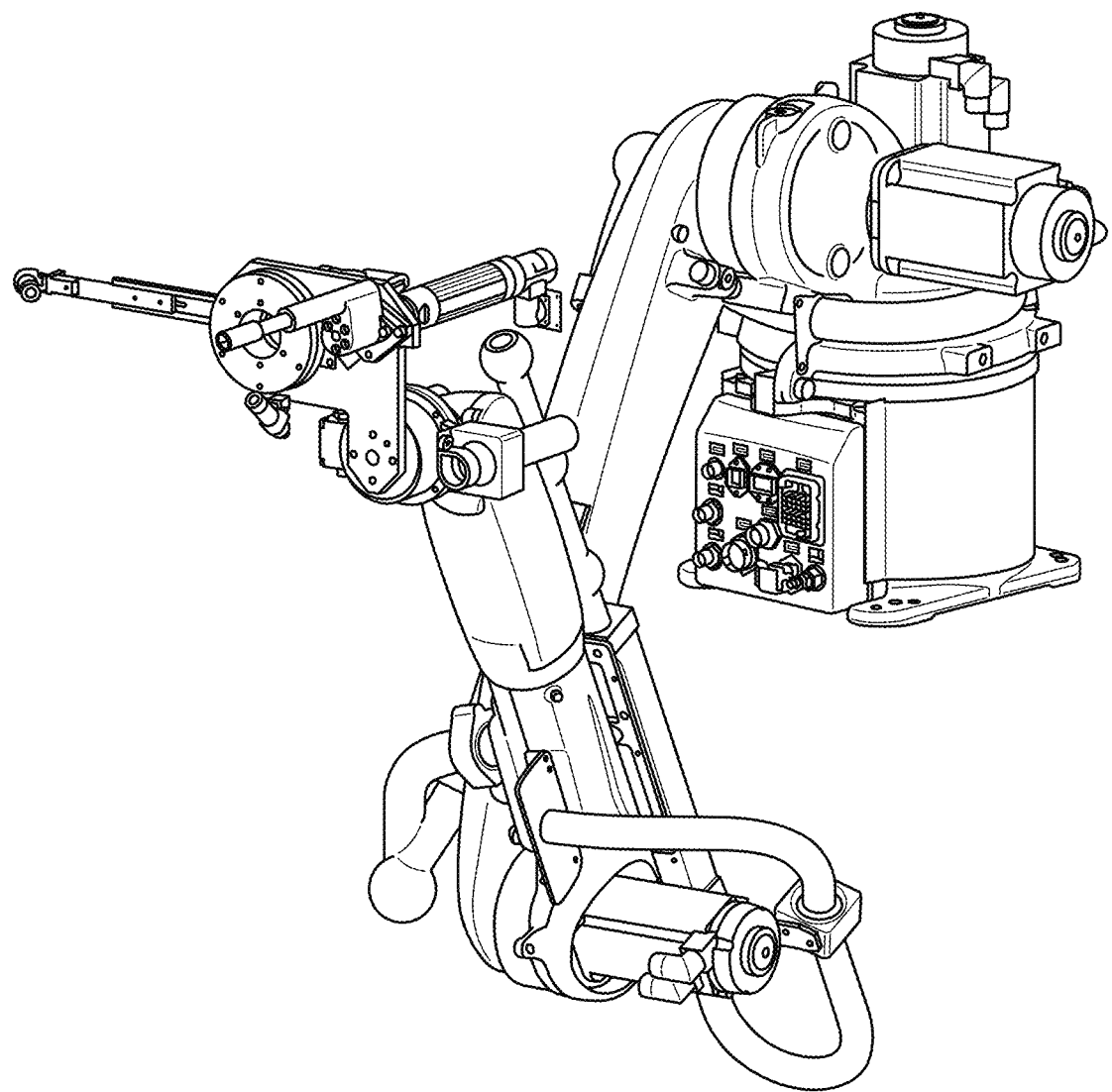
Figure 30:
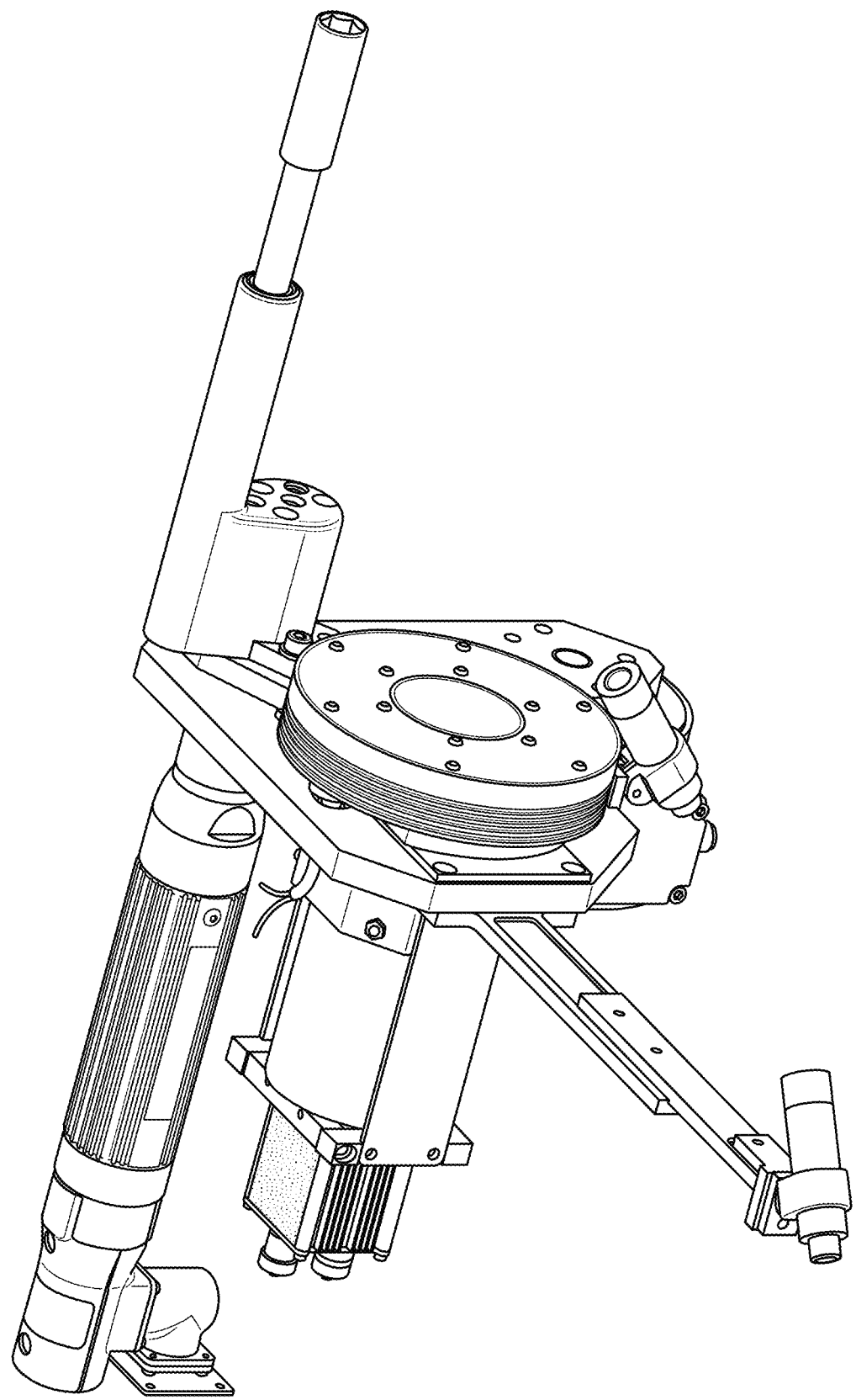
Figure 31:
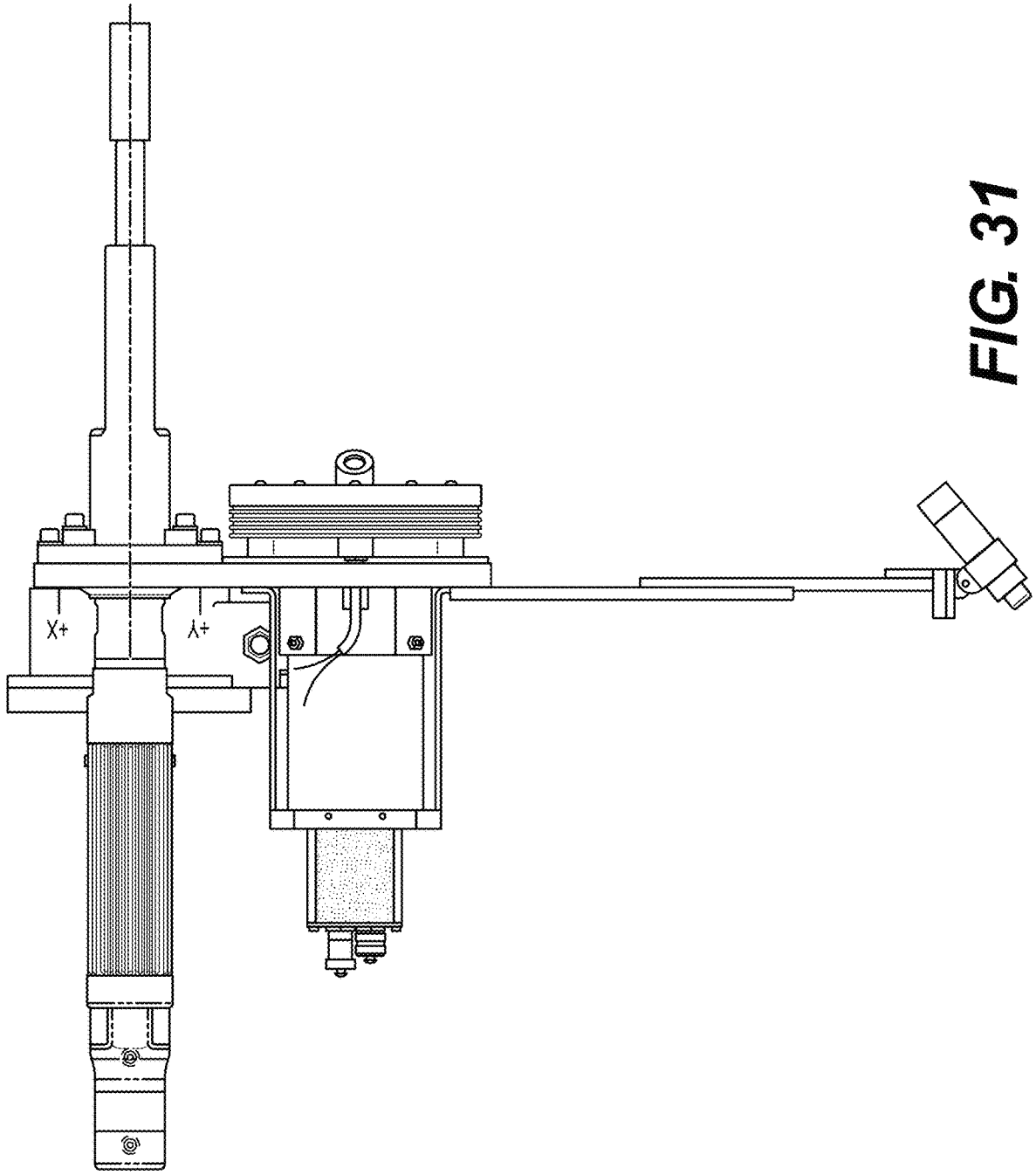
Figure 31:
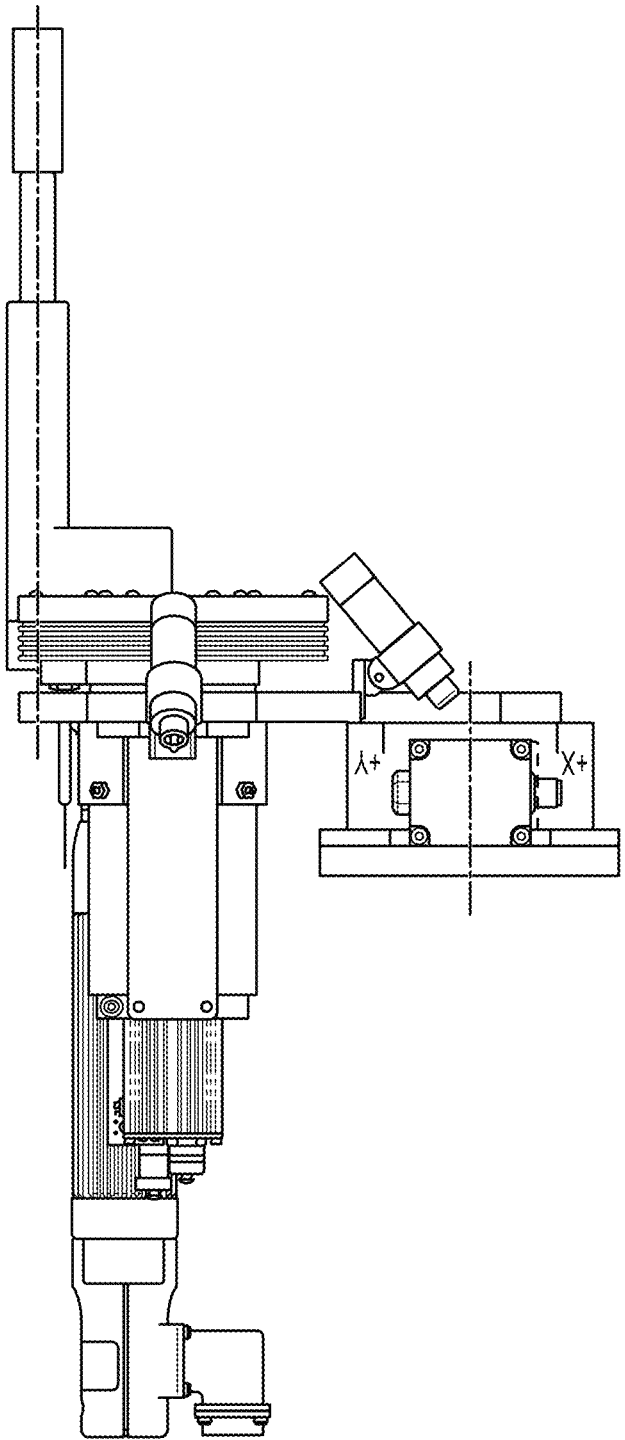
Figure 32:
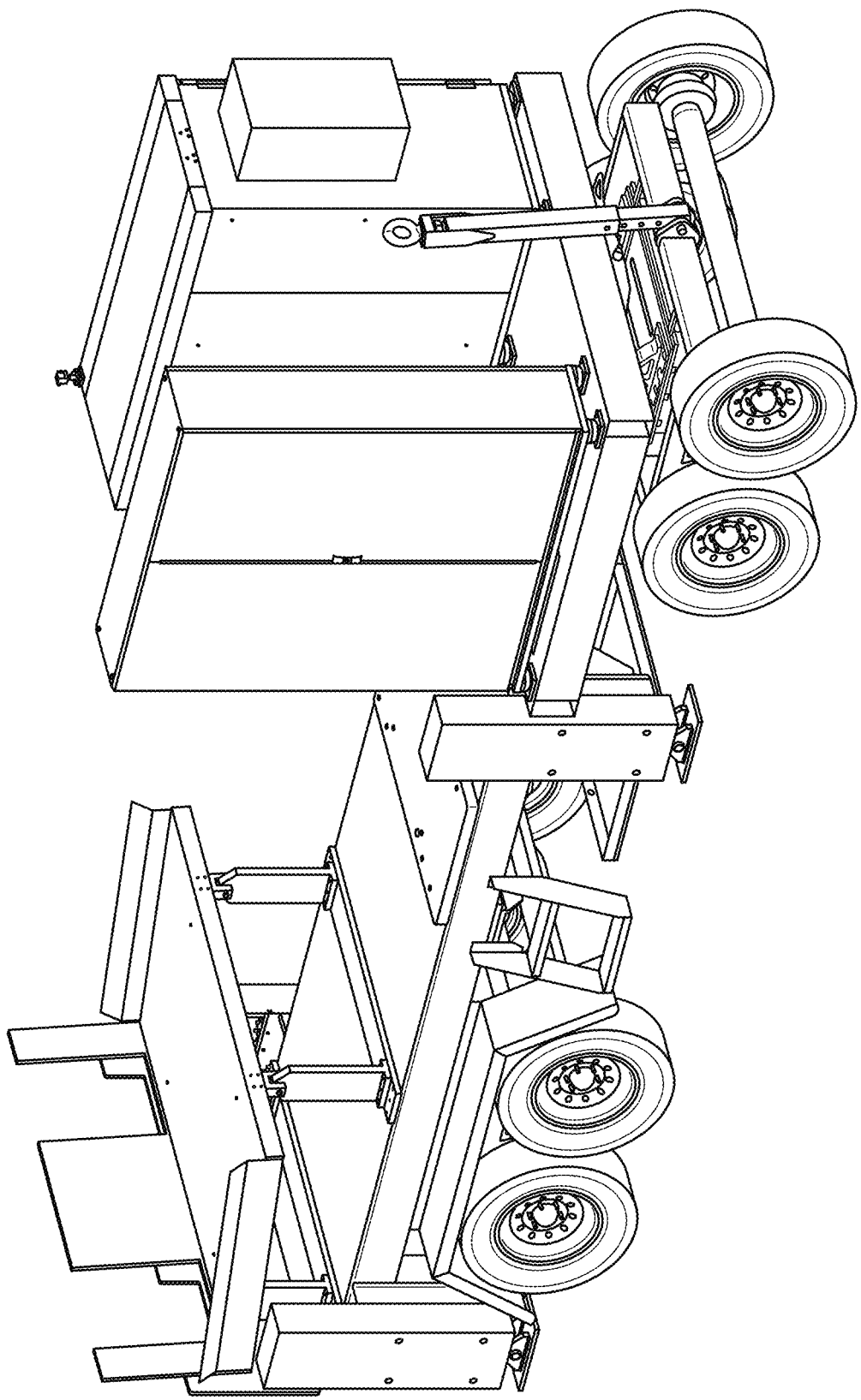
Figure 33:
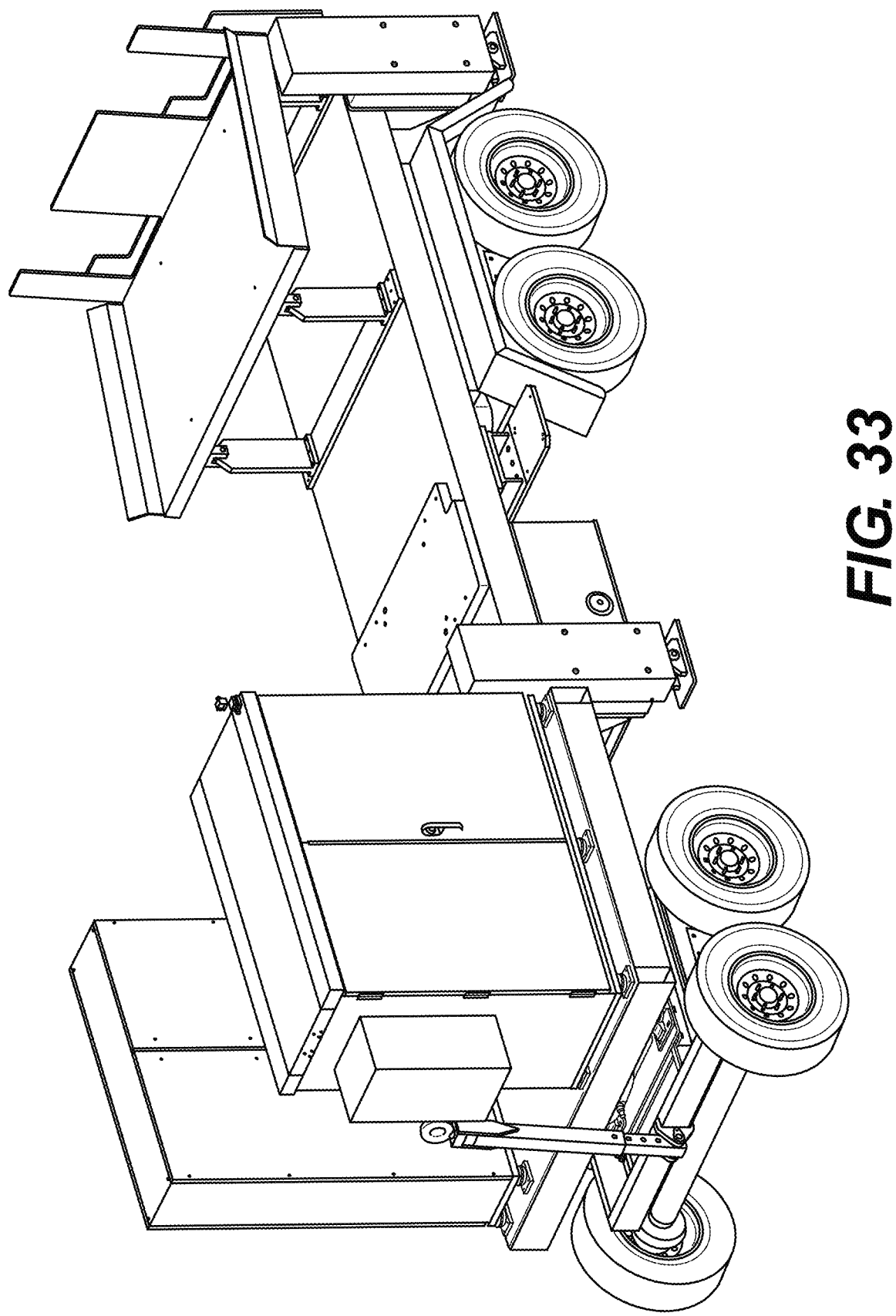
Figure 34:
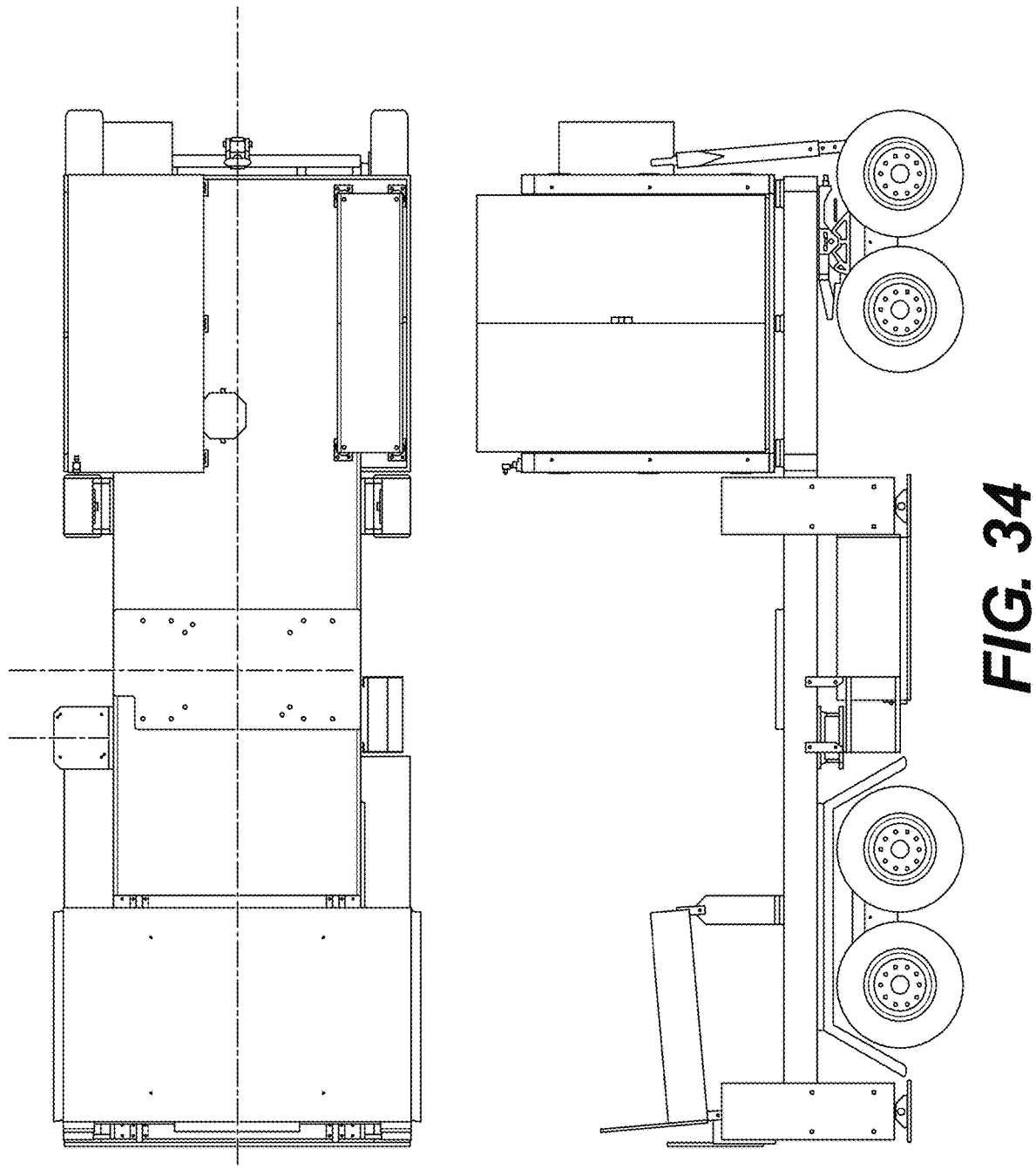
Figure 34:
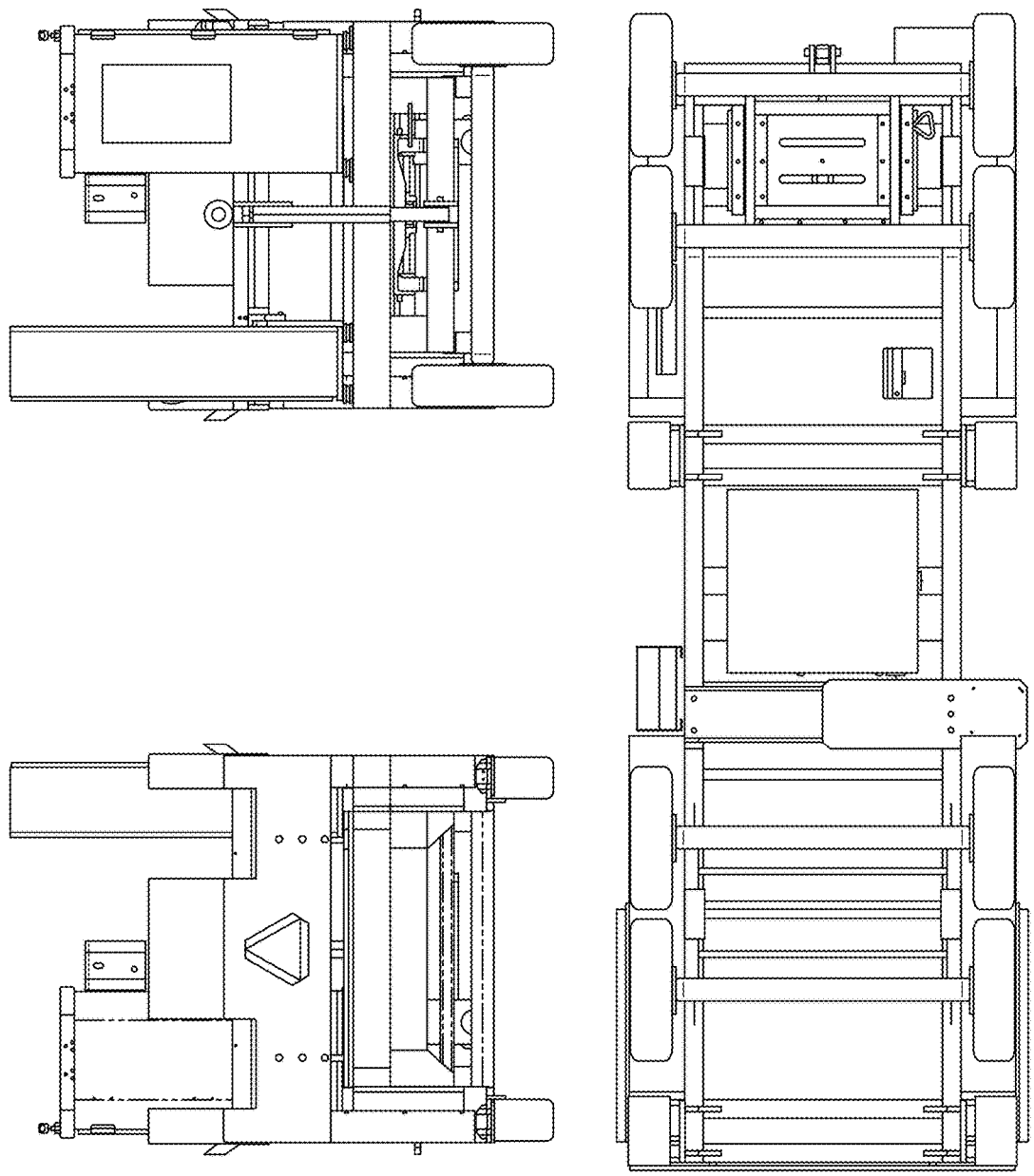

In some embodiments, as illustrated in FIG. 14, if module vehicles are used with the ground vehicle, the module vehicles may be exchanged with new module vehicles when all solar panels of the module vehicle are installed. Here, the computer vision process may be used to communicate with and to control an autonomous independent vehicle, such as a forklift, to bring additional solar panel boxes. Thus, the supply of solar panels may be replenished.

In the replenishment operation using the example of a forklift, the forklift (whether autonomous, remote controlled or manually operated) may be used to return empty boxes or containers of the solar panels to a waste area, remove straps, open lids, or cut away box faces from boxes being delivered, pick up boxes to correct rotation/orientation of the solar panels, or other tasks. Further, the forklift may be maintained near the ground vehicle to wait for the system to deplete the next box of solar panels. Thus, the forklift may manually or autonomously discard a depleted box, position a next box on the ground vehicle or the module vehicle, open box (including removing straps, opening lids, or cutting away box faces) and back away from the ground vehicle/module vehicle. As described, the replenishment may be autonomous, remote controlled, or manually operated, for example.

FIGS. 15-34 provide detailed illustrations of an example configuration for a system for installing solar panels according to an embodiment of the present disclosure.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the art that various modifications and variations can be made in the system for installing a solar panel of the present invention without departing from the spirit or scope of the invention. Thus, it is intended that the present invention cover the modifications and variations of this invention provided they come within the scope of the appended claims and their equivalents. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system for installing a solar panel, the system comprising:
    an end of an arm assembly tool comprising a frame and a plurality of attachment devices coupled to the frame; and
    a linear guide assembly coupled to the end of arm assembly tool, wherein the linear guide assembly includes:
        a linearly moveable clamping tool including an engagement member configured to engage a clamp assembly slidably coupled to an installation structure, and
        a force torque transducer configured to move the clamping tool along the installation structure, and
        a controller configured to control the force torque transducer and the plurality of attachment devices.

2. The system of claim 1, further comprising an optical sensor configured to sense an orientation of the solar panel relative to the installation structure.

3. The system according to claim 2, further comprising an orientation assembly configured to tilt the end of arm assembly tool relative to the installation structure,
    wherein the controller is configured to control the orientation assembly to enable leveling of the solar panel relative to the installation structure based on an input from the optical sensor.

4. The system according to claim 1, wherein the installation structure comprises a torque tube having an octagonal cross-section and the clamp assembly is configured to slide along a side of the torque tube.

5. The system according to claim 1, further comprising an orientation assembly configured to tilt the end of arm assembly tool relative to the installation structure.

6. The system according to claim 1, wherein the controller is configured to actuate the force torque transducer to enable the engagement member, during operation, to engage or disengage the clamp assembly.

7. The system according to claim 1, wherein the controller is further configured to activate or deactivate the plurality of attachment devices so as to couple or release the solar panel to the frame during operation.

8. The system according to claim 1, further comprising an assembly moving robot coupled to the end of arm assembly tool and configured to position the end of arm assembly tool relative the installation structure.

9. The system of claim 8, wherein the assembly moving robot is further configured to position the end of arm assembly tool relative to a stack of solar panels enabling, during operation, the end of arm assembly tool to obtain a solar panel among the stack of solar panels.

10. The system according to claim 8, wherein the assembly moving robot is operably coupled to the force torque transducer.

11. The system according to claim 8, wherein the assembly moving robot includes an autonomously driven ground vehicle having the arm assembly tool attached thereto.

12. The system according to claim 11, wherein the assembly moving robot further includes at least one module vehicle configured to store the solar panel before installation.

13. The system according to claim 8, wherein the assembly moving robot includes at least one module vehicle configured to store the solar panel before installation, and wherein the at least one module vehicle is autonomously driven.

14. The system according to claim 13, wherein the assembly moving robot includes a ground vehicle having the arm assembly tool attached thereto.

15. The system according to claim 1, wherein the linear guide assembly further comprises a proximity sensor configured to sense a distance between the side of the solar panel and the engagement member.

16. The system according to claim 1, wherein the linear guide assembly further comprises a roller enabling a movement of the engagement member along the installation structure.

17. The system according to claim 1, further including a control system, wherein the control system receives operation instructions from a neural network.

18. A method of installing a solar panel, the method comprising:
engaging an end of an arm assembly tool with the solar panel, the end of the arm assembly tool comprising a frame and plurality of attachment devices coupled to the frame;
positioning the solar panel relative to an installation structure having a clamp assembly slidably coupled thereto;
engaging a linear guide assembly coupled to the end of arm assembly tool with the clamp assembly, the linear guide assembly comprising a linearly moveable clamping tool including an engagement member configured to engage the clamp assembly and a force torque transducer configured to move the clamping tool along the installation structure; and
actuating the force torque transducer to move the clamp assembly along the installation structure so as to engage with a side of the solar panel, thereby fixing the solar panel relative to the installation structure.

19. The method of claim 18, further comprising leveling the solar panel relative to the installation structure.

20. The method of claim 18, wherein the installation structure comprises a torque tube having an octagonal cross-section, and wherein positioning the solar panel comprises positioning the solar panel relative to a side of the torque tube.

21. The method of claim 18, wherein engaging the end of arm assembly tool comprises positioning the frame relative to the solar panel and removably coupling the solar panel to the frame using the plurality of attachment devices.

22. The method of claim 18, wherein engaging the linear guide assembly comprises sensing a position of the clamp assembly along the installation structure and actuating the force torque transducer to position the linear guide assembly to enable engagement between the engagement member and the clamp assembly.

23. The method of claim 18, wherein the arm assembly tool is attached to an autonomously driven ground vehicle, and further comprising a step of driving the autonomously driving ground vehicle relative to the installation structure.

24. The method of claim 23, wherein an assembly moving robot includes the autonomously driven ground vehicle having the arm assembly tool attached thereto.

25. The method of claim 18, wherein the arm assembly tool is attached to a non-driven ground vehicle, and further comprising a step of moving the non-driven ground vehicle relative to the installation structure with an autonomously driving ground vehicle.

26. The method of claim 18, further comprising operating a control system of the arm assembly tool based on operation instructions received by the control system from a neural network.

* * * * *